(12) United States Patent
Chen et al.

(10) Patent No.: US 12,538,819 B2
(45) Date of Patent: Jan. 27, 2026

(54) INDUCTOR RF ISOLATION STRUCTURE IN AN INTERPOSER AND METHODS OF FORMING THE SAME

(71) Applicant: Taiwan Semiconductor Manufacturing Company Limited, Hsinchu (TW)

(72) Inventors: Hsien-Wei Chen, Hsinchu (TW); Meng-Liang Lin, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 591 days.

(21) Appl. No.: 17/857,247

(22) Filed: Jul. 5, 2022

(65) Prior Publication Data
US 2024/0014115 A1    Jan. 11, 2024

(51) Int. Cl.
| | |
|---|---|
| H01L 23/498 | (2006.01) |
| H01F 27/28 | (2006.01) |
| H01L 21/48 | (2006.01) |
| H01L 23/00 | (2006.01) |
| H01L 23/14 | (2006.01) |
| H01L 23/552 | (2006.01) |
| H01L 23/58 | (2006.01) |
| H01L 25/065 | (2023.01) |
| H01L 25/18 | (2023.01) |

(52) U.S. Cl.
CPC ... *H01L 23/49838* (2013.01); *H01F 27/2804* (2013.01); *H01L 21/4857* (2013.01); *H01L 23/552* (2013.01); *H01L 23/585* (2013.01); *H01L 25/0655* (2013.01); *H01L 25/18* (2013.01); *H01L 23/145* (2013.01); *H01L 23/49822* (2013.01); *H01L 23/49833* (2013.01); *H01L 24/16* (2013.01); *H01L 24/32* (2013.01); *H01L 24/73* (2013.01); *H01L 2224/16238* (2013.01); *H01L 2224/32238* (2013.01); *H01L 2224/73204* (2013.01); *H01L 2924/1902* (2013.01); *H01L 2924/19042* (2013.01)

(58) Field of Classification Search
None
See application file for complete search history.

(56) References Cited

U.S. PATENT DOCUMENTS

| | | | |
|---|---|---|---|
| 2003/0127704 A1* | 7/2003 | Kobayashi | H01L 23/552 |
| | | | 257/E23.114 |
| 2004/0178472 A1* | 9/2004 | Zhang | H01L 23/645 |
| | | | 257/E23.114 |

(Continued)

*Primary Examiner* — Julio J Maldonado
*Assistant Examiner* — Pinaki Das
(74) *Attorney, Agent, or Firm* — The Marbury Law Group, PLLC

(57) ABSTRACT

A semiconductor structure includes an interposer including redistribution wiring interconnects and redistribution insulating layers; a first semiconductor die attached to the interposer through a first array of solder material portions; and a second semiconductor die attached to the interposer through a second array of solder material portions. The interposer includes at least one inductor structure located between an area of the first array of solder material portions and an area of the second array of solder material portions in a plan view and laterally encloses a respective area in the plan view.

20 Claims, 20 Drawing Sheets

(56) References Cited

U.S. PATENT DOCUMENTS

| | | | | |
|---|---|---|---|---|
| 2009/0321890 | A1* | 12/2009 | Jeng | H01L 23/562 |
| | | | | 257/E23.193 |
| 2019/0333875 | A1* | 10/2019 | Liao | H01L 23/645 |
| 2020/0243443 | A1* | 7/2020 | Kuwabara | H01L 23/5227 |
| 2020/0312766 | A1* | 10/2020 | Bhagavat | H01L 23/5383 |

* cited by examiner

INDUCTOR RF ISOLATION STRUCTURE IN AN INTERPOSER AND METHODS OF FORMING THE SAME

BACKGROUND

Radio-frequency (RF) interference resulting between signals propagating through adjacent regions within an interposer, may hamper high frequency signal transmission through the interposer. Such RF interferences between signals generated from, or directed to, an adjacent pair of semiconductor dies that are attached to the same interposer may have deleterious effects on overall performance of a fan-out wafer-level package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
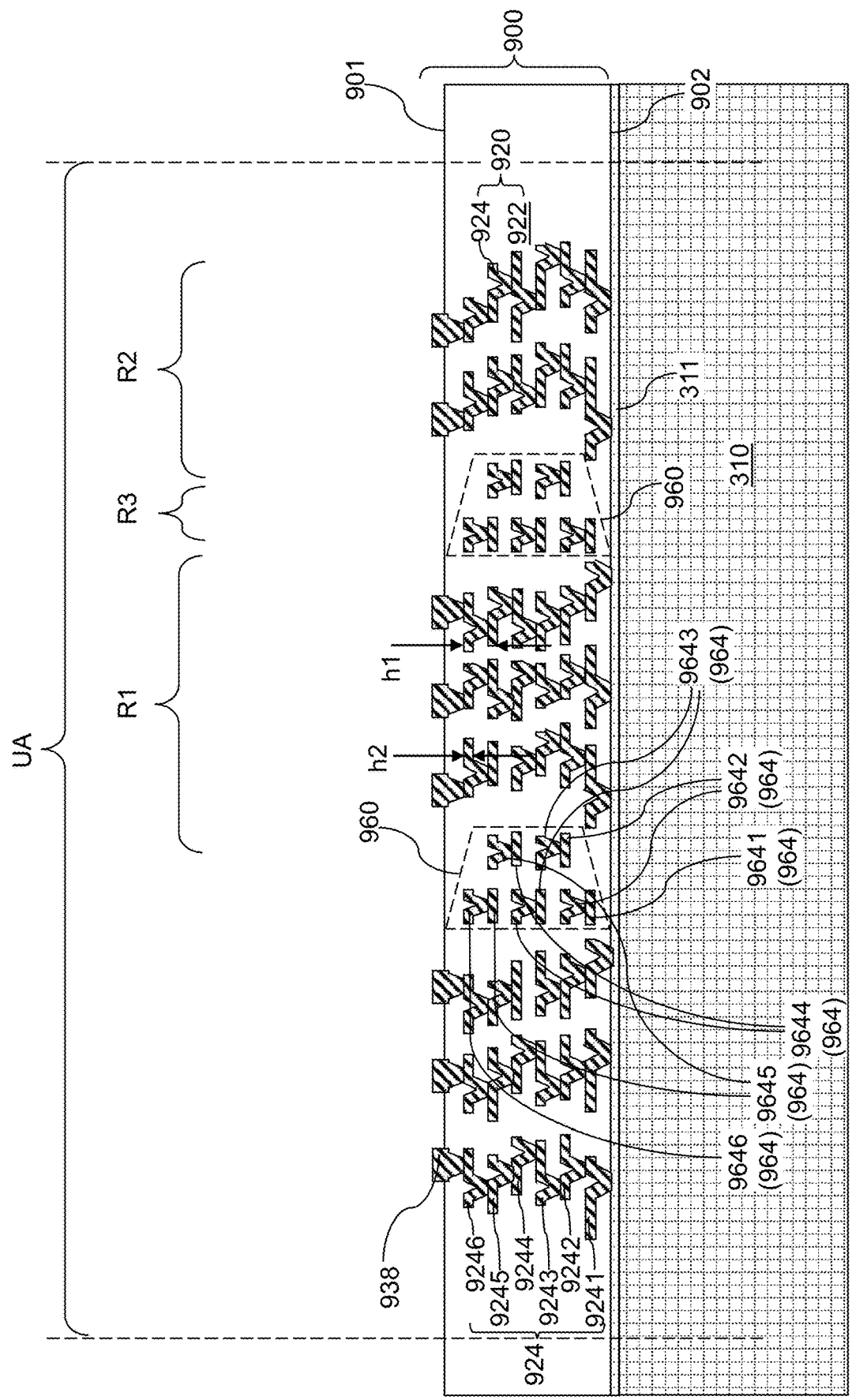
FIG. 1 is a vertical cross-sectional view of a region of a structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a semiconductor structure including an interposer that contains an inductor structure configured to provide radio-frequency (RF) isolation and methods for forming the same. Specifically, an inductor structure may be formed in an interposer that may also include redistribution layers. The interposer may be an organic interposer including polymer materials as redistribution dielectric layers, and may be configured to mount two or more semiconductor dies. The inductor structure(s) may be provided in areas between neighboring pairs of semiconductor dies. The inductor structure(s) may be advantageously used to improve electrical performance of the interposer by reducing radio-frequency signal interferences across redistribution wiring interconnects located underneath different semiconductor dies. Generally, each inductor structure may be formed as a spiral-like metal line-via routing structure within the interposer. The metal line-via routing structure may be formed in a series stacking interconnection, and/or in a parallel stacking interconnection.

Referring to FIG. 1, a structure according to an embodiment of the present disclosure may include a first carrier substrate 310 and interposers 900 formed on a front side surface of the first carrier substrate 310. The first carrier substrate 310 may include an optically transparent substrate such as a glass substrate or a sapphire substrate. The diameter of the first carrier substrate 310 may be in a range from 150 mm to 290 mm, although lesser and greater diameters may be used. In addition, the thickness of the first carrier substrate 310 may be in a range from 500 microns to 2,000 microns, although lesser and greater thicknesses may also be used. Alternatively, the first carrier substrate 310 may be provided in a rectangular panel format. The dimensions of the first carrier in such alternative embodiments may be substantially the same.

A first adhesive layer 311 may be applied to the front-side surface of the first carrier substrate 310. In one embodiment, the first adhesive layer 311 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 311 may include a thermally decomposing adhesive material. For example, the first adhesive layer 311 may include an acrylic pressure-sensitive adhesive that decomposes at an elevated temperature. The debonding temperature of the thermally decomposing adhesive material may be in a range from 150 degrees to 200 degrees Celsius.

Interposers 900 may be formed over the first adhesive layer 311. Specifically, an interposer 900 may be formed within each unit area UA, which is the area of a repetition unit that may be repeated in a two-dimensional array over the first carrier substrate 310. The combination of redistribution dielectric layers 922 and redistribution wiring interconnects 924 constitutes a redistribution structure 920. Each interposer 900 includes a respective portion of a redistribution structure 920. In one embodiment, each interposer 900 comprises a die-side horizontal surface 901 located on a side to which semiconductor dies are to be subsequently attached, and a substrate-side horizontal surface 902 located at an opposite side of the die-side horizontal surface 901.

According to an aspect of the present disclosure, each organic interposer 900 comprises redistribution wiring interconnects 924 and at least one inductor structure 960. The at least one inductor structure 960 comprises metal wiring interconnects 964 (e.g., 9641, 9642, 9643, 9644, 9645, 9646). The redistribution wiring interconnects 924 and the metal wiring interconnects 964 may be located at multiple levels having different vertical spacings from a horizontal plane including the substrate-side horizontal surface 902 (also different vertical spacings from a horizontal plane including die-side horizontal surface 901).

The redistribution dielectric layers 922 include a respective dielectric polymer material such as polyimide (PI), benzocyclobutene (BCB), or polybenzobisoxazole (PBO). Other suitable dielectric polymer materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 and the metal wiring interconnects 964 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution wiring interconnects 924 and the metal wiring interconnects 964 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 900 (i.e., the levels of the redistribution wiring interconnects 924 and the metal wiring interconnects 964) may be in a range from 1 to 10. Each level may include a respective subset of the redistribution wiring interconnects 924 and a respective subset of the metal wiring interconnects 964.

A periodic two-dimensional array (such as a rectangular array) of interposers 900 may be formed over the first carrier substrate 310. Each interposer 900 may be formed within a unit area UA. The layer including all interposers 900 is herein referred to as an interposer layer. The interposer layer includes a two-dimensional array of interposers 900. In one embodiment, the two-dimensional array of interposers 900 may be a rectangular periodic two-dimensional array of interposers 900 having a first periodicity along a first horizontal direction hd1 and having a second periodicity along a second horizontal direction hd2 that is perpendicular to the first horizontal direction hd1.

At least one metallic material may be deposited over the front-side surface of the redistribution structures 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The at least one metallic material may be patterned into arrays of metal bonding structures, which are herein referred to as arrays of interposer-side bump structures 938. Each array of interposer-side bump structures 938 may be formed within a respective unit area UA.

In one embodiment, the interposer-side bump structures 938 may include, and/or may consist essentially of, copper or a copper-containing alloy. Other suitable materials are within the contemplated scope of disclosure. The thickness of the interposer-side bump structures 938 may be in a range from 5 microns to 60 microns, although lesser or greater thicknesses may also be used. The interposer-side bump structures 938 may have horizontal cross-sectional shapes of rectangles, rounded rectangles, circles, regular polygons, irregular polygons, or any other two-dimensional curvilinear shape having a closed periphery. In one embodiment, interposer-side bump structures 938 may be configured for microbump bonding (i.e., C2 bonding), and may have a thickness in a range from 10 microns to 30 microns, although lesser or greater thicknesses may also be used. In this embodiment, each array of interposer-side bump structures 938 may be formed as an array of microbumps (such as copper pillars) having a lateral dimension in a range from 10 microns to 25 microns, and having a pitch in a range from 20 microns to 50 microns.

In one embodiment, each of the at least one inductor structure 960 comprises a respective set of metal wiring interconnects 964 having a same material composition as the redistribution wiring interconnects 924. Each of the at least one inductor structure 960 laterally encloses a respective area in a plan view. In one embodiment, the redistribution wiring interconnects 924 are located at multiple levels having different vertical spacings from the horizontal plane including the substrate-side horizontal surface 902, and the metal wiring interconnects 964 comprise a same material as the redistribution wiring interconnects 924. Each of the metal wiring interconnects 964 may be vertically spaced from the horizontal plane including the substrate-side horizontal surface 902 by a same vertical spacing as a respective one of the redistribution wiring interconnects 924. In one embodiment, one, and/or a plurality, of the metal wiring interconnects 964 comprises a horizontally-extending line portion and at least one vertically-extending via portion that contacts a horizontally-extending line portion of another of the metal wiring interconnects 964 that overlie the respective metal wiring interconnects 964 (and vice versa for metal wiring interconnect 964 that underlie a respective metal wiring interconnect 964). For example, a vertically-extending via portion of second metal wiring interconnects 9642 may contact a horizontally-extending line portion of the first metal wiring interconnects 9641, which second metal wiring interconnects 9642 overlies.

The total number of levels of the redistribution wiring interconnects 924 and the metal wiring interconnects 964 may be in a range from 2 to 20, such as from 3 to 12, and/or from 4 to 8, although a greater number of redistribution wiring interconnects 924 and the metal wiring interconnects 964 may also be used. In an illustrative example shown in FIG. 1, the redistribution wiring interconnects 924 may comprise six levels of redistribution wiring interconnects 924, and the metal wiring interconnects 964 may comprise six levels of metal wiring interconnects 964. In this embodiment, the redistribution wiring interconnects 924 may comprise first redistribution wiring interconnects 9241 formed at a first level that is most proximate to the first carrier wafer 310, second redistribution wiring interconnects 9242 formed at a second level overlying the first level, third redistribution wiring interconnects 9243 formed at a third level overlying the second level, fourth redistribution wiring interconnects 9244 formed at a fourth level overlying the third level, fifth redistribution wiring interconnects 9245 formed at a fifth level overlying the fourth level, and sixth redistribution wiring interconnects 9246 formed at a sixth level overlying the fifth level. The interposer-side bump structures 938 may be formed directly on the sixth redistribution wiring interconnects 9246. The metal wiring interconnects 964 may comprise first metal wiring interconnects 9641 formed at a first level that is most proximate to the first carrier wafer 310, second metal wiring interconnects 9642 formed at a second level overlying the first level, third metal wiring interconnects 9643 formed at a third level overlying the second level, fourth metal wiring interconnects 9644 formed at a fourth level overlying the third level, fifth metal wiring interconnects 9645 formed at a fifth level overlying the fourth level, and sixth metal wiring interconnects 9646 formed at a sixth level overlying the fifth level. The first metal wiring interconnects 9641 and the first redistribution wiring interconnects 9241 have bottom surfaces in the horizontal plane including the second horizontal surface 902. The second metal wiring interconnects 9642 and the second redistribution wiring interconnects 9242 may be equidistant from the second horizontal surface 902. The third metal wiring interconnects 9643 and the third redistribution wiring interconnects 9243 may be equidistant from the second horizontal surface 902. The fourth metal wiring interconnects 9644 and the fourth redistribution wiring interconnects 9244 may be equidistant from the second horizontal surface 902. The fifth metal wiring interconnects 9645 and the fifth redistribution wiring interconnects 9245 may be equidistant from the second horizontal surface 902. The sixth metal wiring interconnects 9646 and the sixth redistribution wiring interconnects 9246 may be equidistant from the second horizontal surface 902.

The number of levels of the redistribution dielectric layers 922 is at least two. A metal wiring interconnect 964 may include a metal line portion (i.e., a horizontally-extending portion that is also referred to as a metal pad portion) and at least one metal via portion. The combination of the metal line portion and the at least one metal via portion may have a thickness between a top surface of the metal line portion and the bottom surface(s) of the at least one metal via portion, which is herein referred to as a first height h1. The metal line portion may have a thickness between a top surface thereof and a bottom surface thereof, which is herein referred to as a second height h2. The ratio of the second height h2 to the first height h1 may be in a range from 0.1 to 0.95. The first height h1 may be in a range from 1 micron to 20 microns, such as from 2 microns to 10 microns, although lesser and greater heights may also be used. The second height h2 may be in a range 0.5 micron to 5 microns, although lesser and greater heights may also be used.

Generally, each organic interposer 900 comprises a stack of redistribution insulating layers 922, a first set of redistribution wiring interconnects 924 laterally surrounded by the stack of redistribution insulating layers 922 and located in a first region R1 in which a first semiconductor die is to be subsequently attached, and a second set of redistribution wiring interconnects 924 laterally surrounded by the stack of redistribution insulating layers 922 and located in a second region R2 in which a second semiconductor die is to be subsequently formed. At least one inductor structure 960 laterally surrounded by the stack of redistribution insulating layers 922 may be located in a third region R3 between the first region R1 and the second region R2. Each of the at least one inductor structure 960 comprises a respective set of metal wiring interconnects 964 having a same material composition as the first set of redistribution wiring interconnects 924 and the second set of redistribution wiring interconnects 924. In one embodiment, each metal wiring interconnect among the plurality of respective metal wiring interconnects 964 is equidistant from the horizontal plane including the substrate-side horizontal surface 902 as a respective redistribution wiring interconnects among the first set of redistribution wiring interconnects 924, and as a respective redistribution wiring interconnects among the second set of redistribution wiring interconnects 924. Each of the at least one inductor structure 960 laterally encloses a respective area in a plan view.

Figure 2A:
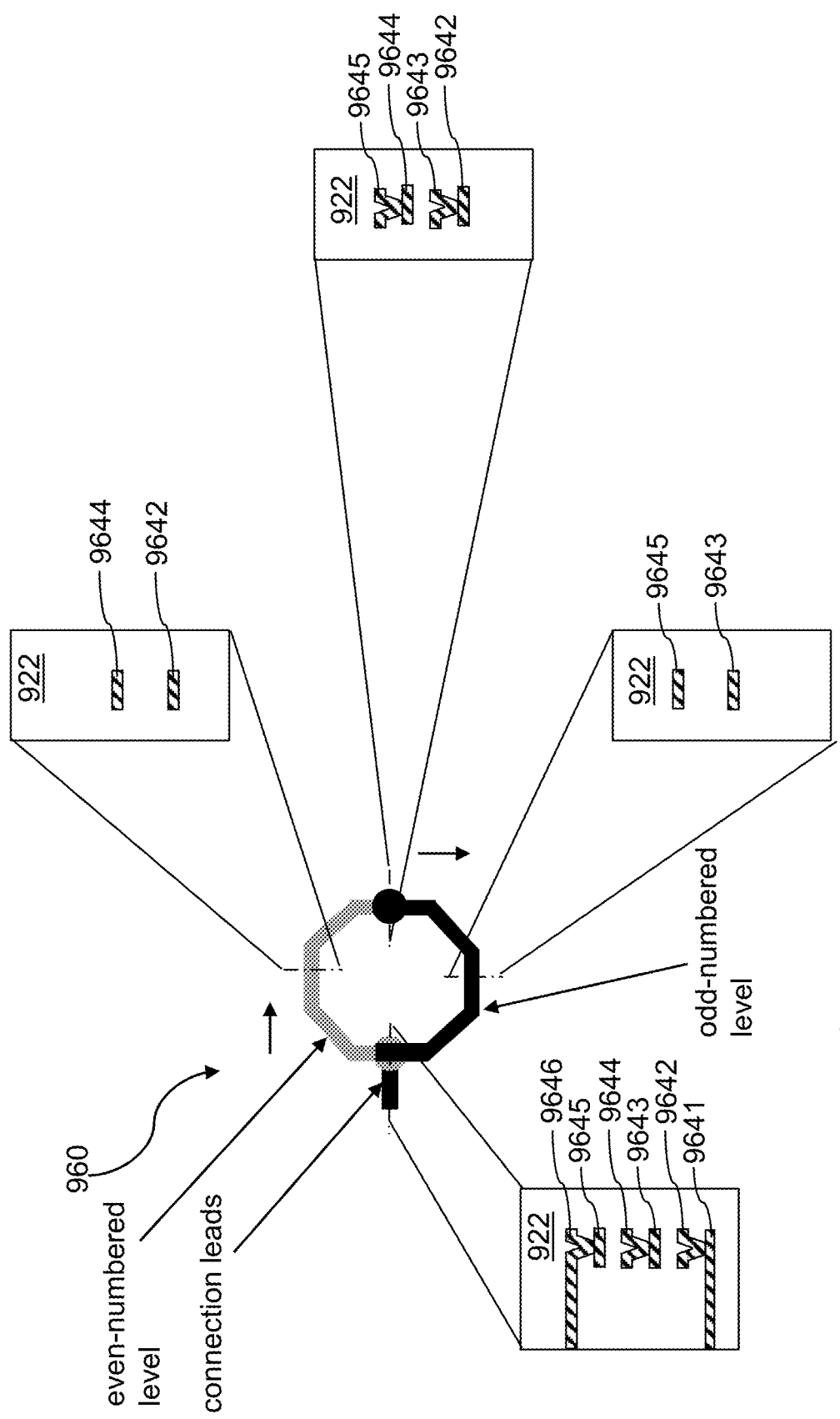
FIG. 2A illustrates a schematic top-down view of an inductor structure within the structure of FIG. 1. The four insets illustrate vertical cross-sectional views of four segments of the inductor structure.
Figure 2B:
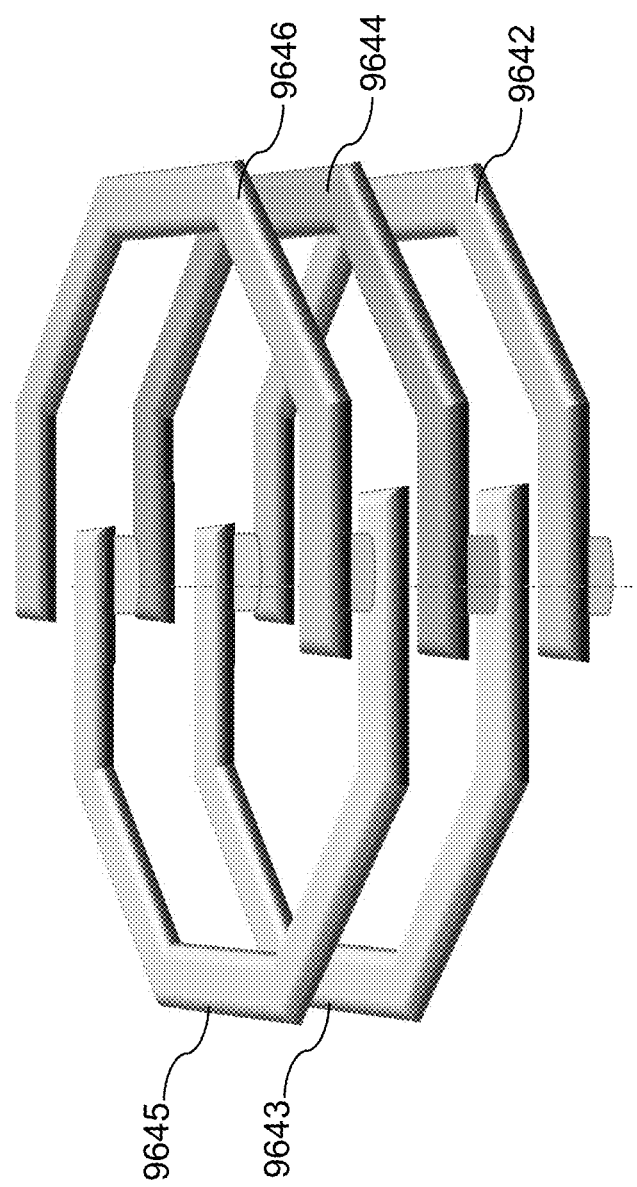
FIG. 2B is a perspective view of the inductor structure of FIG. 2A.

Referring to FIGS. 2A and 2B, an embodiment of an inductor structure 960 within the structure of FIG. 1 is shown. Four insets are shown, which illustrate vertical cross-sectional views of four segments of the inductor structure 960. In one embodiment, each segment of the inductor structure 960 includes at least two metal wiring interconnects 964 that overlie or underlie each other, or one another. In one embodiment, vertically neighboring pairs of metal wiring interconnects 964 may be interconnected to each other by a vertically-extending portion, i.e., a via portion, of an overlying metal wiring interconnect 964.

Generally, each inductor structure 960 comprises a spiral-like configuration of a line and via stack interconnections of the metal wiring interconnect 964 formed within the redistribution dielectric layers 922 of the redistribution structure 920. The at least one inductor structure 960 within each interposer 900 may be formed within a region R3 located between regions R1, R2 of a respective neighboring pair of semiconductor dies to be subsequently attached to the interposer 900. Each inductor structure 960 may be used to prevent, eliminate, and/or reduce (i.e., collectively mitigate) current-coupling interference between electrical routing (comprising the redistribution wiring interconnects 924) to a respective semiconductor die to be subsequently attached to the interposer 900. Each inductor structure 960 may be formed in a configuration of a coil or a winding that defines an enclosed area, which captures a change in the magnetic flux of an externally generated primary magnetic field (which is generated, for example, by electrical current through the redistribution wiring interconnects 924) therethrough. The captured change in the magnetic flux induces an internal electrical current that flows through the inductor structure 960 along a direction that generates a secondary magnetic field that tends to cancel the primary magnetic field, thereby shielding one set of redistribution wiring interconnects 924 located on one side of the inductor structure 960 from electromagnetic radiation (which induces radio-frequency interference for high frequency applications) generated by another set of redistribution wiring interconnects 924 located on the other side of the inductor structure 960. Put another way, the inductor structure 960 formed in region R3 may mitigate against detrimental effects in redistribution wiring interconnects 924 formed in region R1 due to electromagnetic radiation generated in redistribution wiring interconnects 924 formed in region R2, and vice versa. In the illustrated example of FIGS. 2A and 2B, each metal wiring interconnect 964 (e.g., 9641, 9642, 9643, 9644, 9645, 9646) may azimuthally extend about 180 degrees around a vertical axis passing through a geometrical center of an area that is laterally enclosed by a respective inductor structure 960.

Figure 2C:
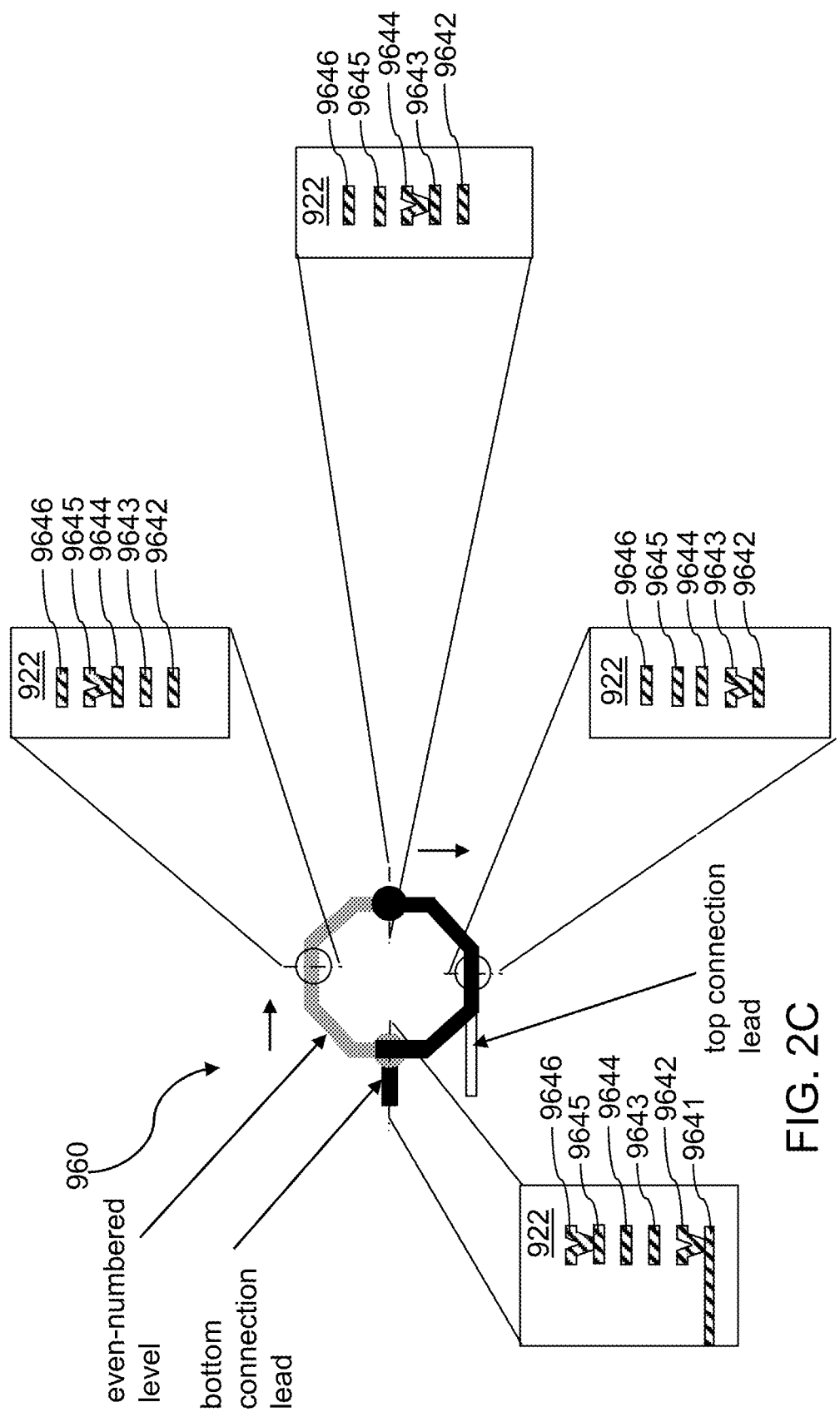
FIG. 2C illustrates a schematic top-down view of an alternative embodiment of the inductor structure within the structure of FIG. 1. The four insets illustrate vertical cross-sectional views of four segments of the inductor structure.

Referring to FIG. 2C, an alternative embodiment of an inductor structure 960 within the structure of FIG. 1 is shown. Four insets are shown, which illustrate vertical cross-sectional views of four segments of the inductor structure 960. Generally, each metal wiring interconnect 964 (e.g., 9641, 9642, 9643, 9644, 9645, 9646) may azimuthally extend any angle less than 360 degrees around a vertical axis passing through a geometrical center of an area that is laterally enclosed by a respective inductor structure 960. In the illustrated example of FIG. 2C, each metal wiring interconnect 964 (e.g., 9641, 9642, 9643, 9644, 9645, 9646) may azimuthally extend about 270 degrees around a vertical axis passing through a geometrical center of an area that is laterally enclosed by a respective inductor structure 960.

The metal wiring interconnect 964 may be designed with a high degree of design flexibility in the metal routing to provide high signal integrity and power integrity. FIGS. 3A-3D and 3F-3H illustrate exemplary configurations for an inductor structure 960 within the structure of FIG. 1.

Figure 3C:
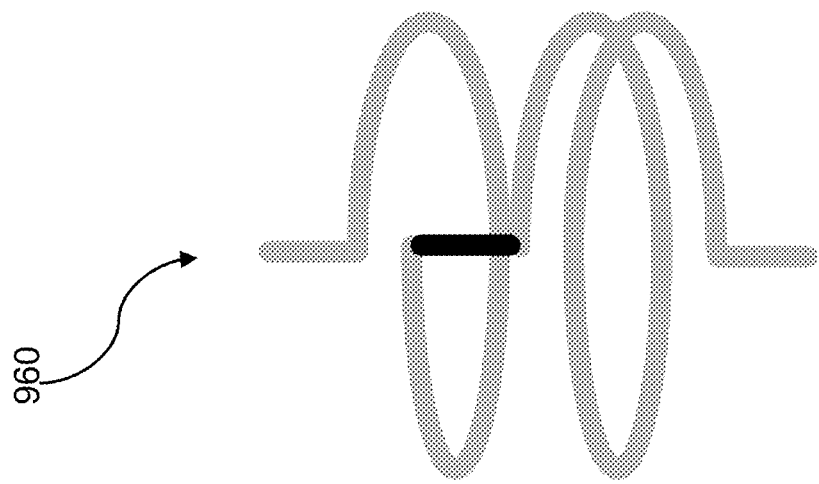
FIGS. 3A-3D and 3F-3H illustrate configurations for an inductor structure within the structure of FIG. 1.
Figure 3B:
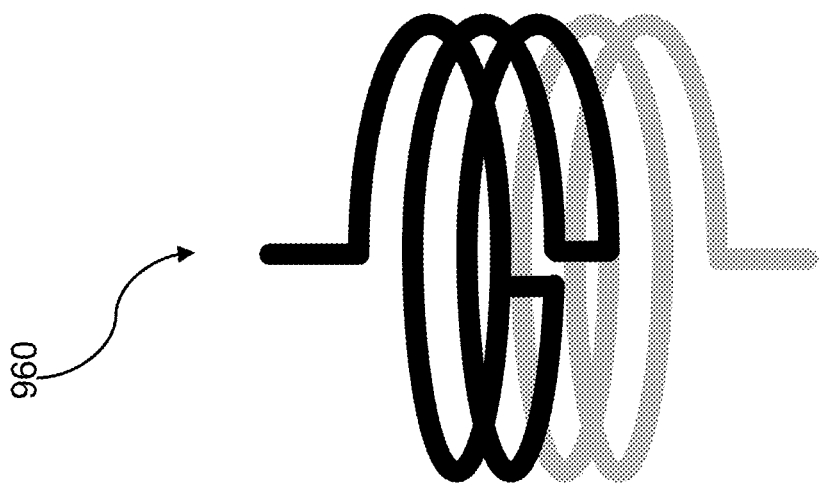
Figure 3A:
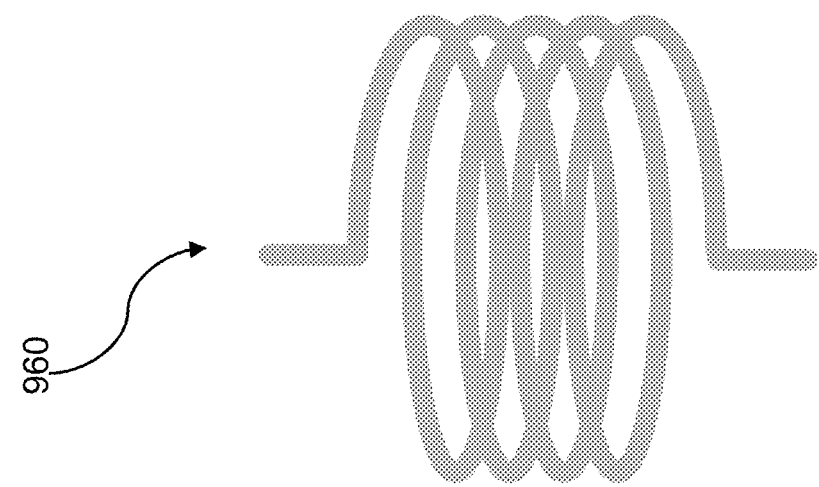

Generally, each inductor structure 960 may be connected to an external circuit (not shown) that may be configured for energy storage. Alternatively or additionally, each inductor structure 960 may be connected to a capacitor or a harmonic filtering circuit (not shown) to enhance general filtering characteristics and/or to tune for filtering of electromagnetic signals in a specific wavelength range. Generally, such an external circuit and/or capacitors and/or harmonic filtering circuits may be provided outside the interposer 900, for example, within semiconductor dies to be subsequently attached to the interposer 900. The spiral-like configuration of each inductor structure 960 may include a single spiral, a plurality of spirals in a parallel connection, and/or a plurality of spirals in a series connection. FIGS. 3A-3C illustrate configurations in which an inductor structure 960 is configured to be connected to an external component. FIG. 3A illustrates a configuration in which an inductor structure 960 includes a single spiral. FIG. 3B illustrates a configuration in which an inductor structure 960 includes two spiral segments that are connected in a parallel connection. FIG. 3C illustrates a configuration in which an inductor structure 960 includes two spiral segments that may be connected in a series connection. In this embodiment, a first inductor structure 960 and a second inductor structure 960 may overlie, or underlie, each other, and may be electrically connected to each other, and may have an areal overlap in the plan view.

Figure 3D:
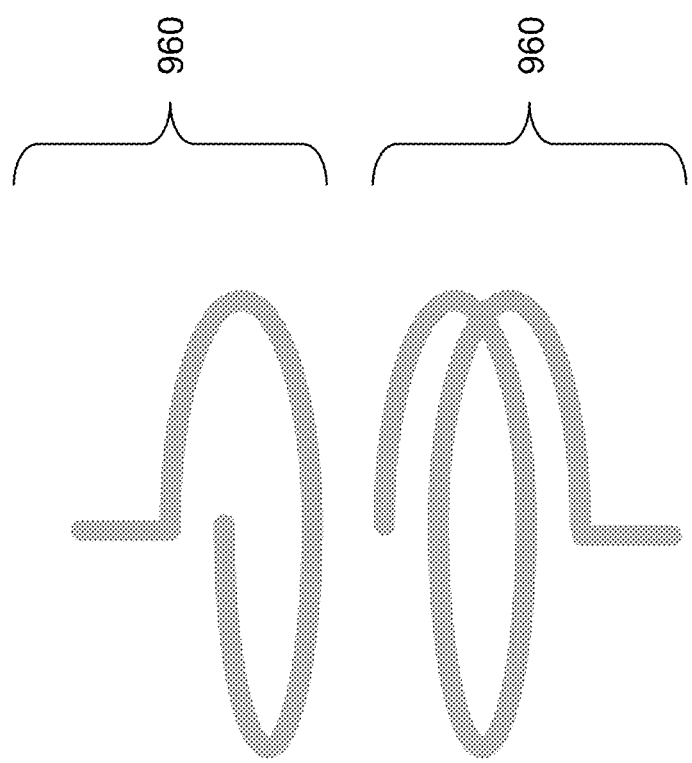
Figure 3E:
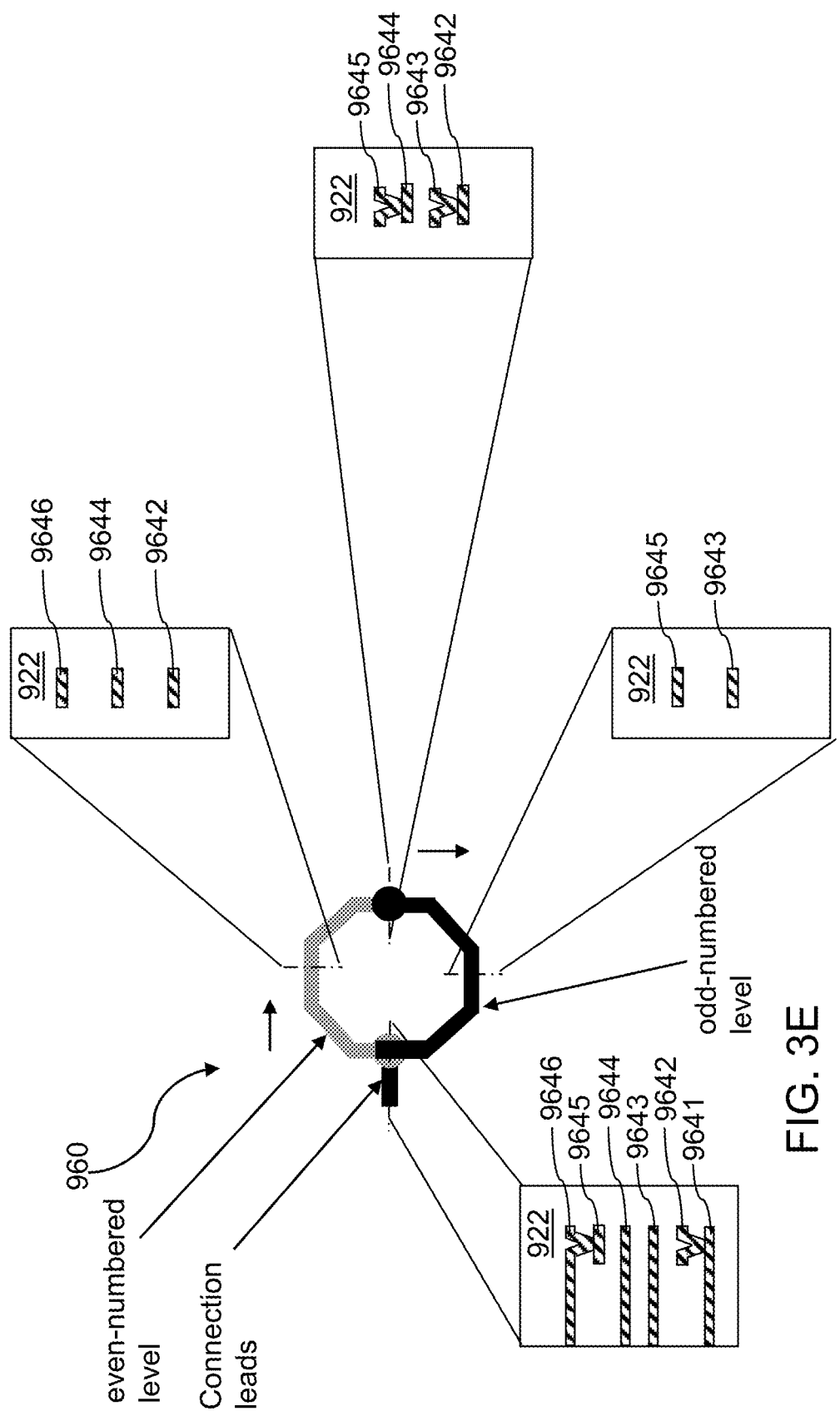
FIG. 3E illustrates a schematic top-down view of an embodiment of the inductor structure of FIG. 3D as implemented within the structure of FIG. 1. The four insets within FIG. 3E illustrate vertical cross-sectional views of four segments of the inductor structure.

Alternatively or additionally, one, a plurality, and/or each of the at least one inductor structure 960 may be formed in a stacked configuration illustrated in FIGS. 3D and 3E. FIG. 3D is a schematic illustration, and FIG. 3E is a schematic top-down view of an embodiment of the inductor structure of FIG. 3D as implemented within the structure of FIG. 1. The four insets within FIG. 3E illustrate vertical cross-sectional views of four segments of the inductor structure. Generally, two or more inductor structures 960 may be stacked along a vertical direction such that the two or more inductor structures 960 have a partial or full areal overlap in a plan view.

Figure 3H:
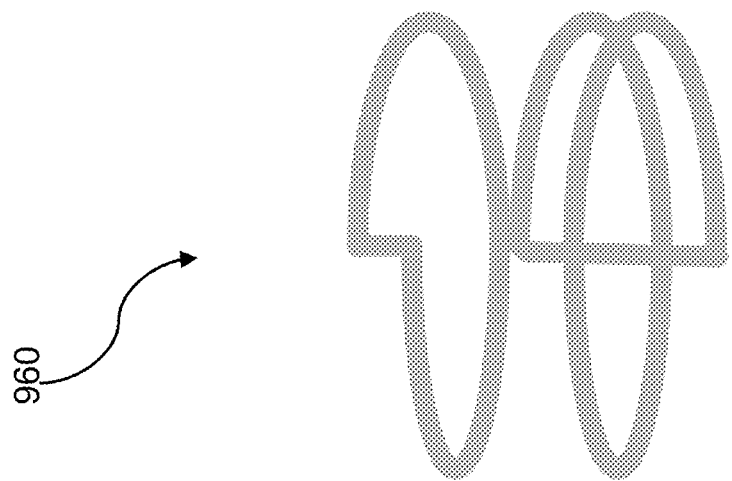
Figure 3G:
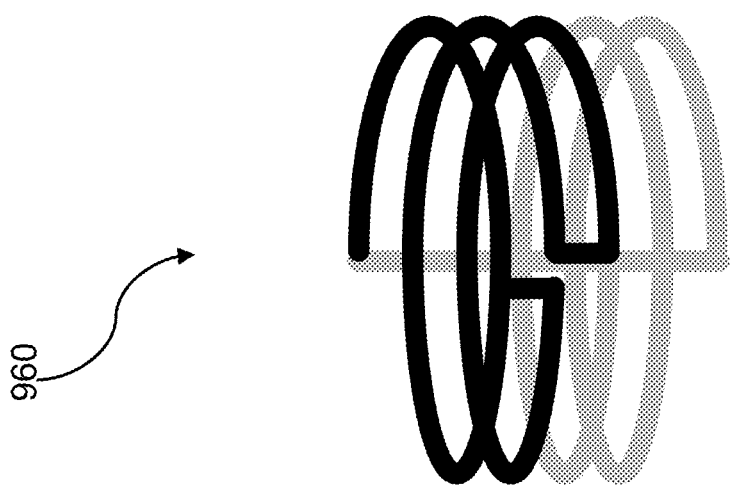
Figure 3F:
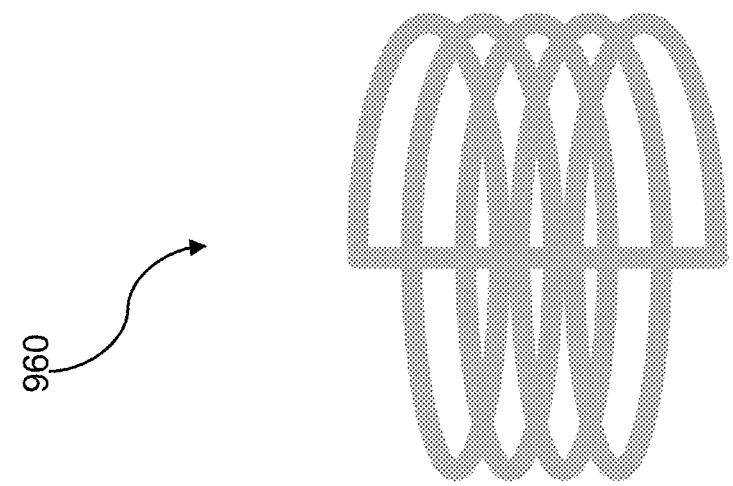

Alternatively or additionally, one, a plurality, and/or each of the at least one inductor structure 960 may be in a closed-loop configuration, and may be electrically isolated from any other conductive structure located within, or on, the organic interposer 900. In this embodiment, the inherent resistance of the metal wiring interconnects 964 in a respective inductor structure 960 provides an inductor-resistor (LR) circuit that dampens, and partially cancels, high frequency electromagnetic radiation that impinges on the respective inductor structure 960. In one embodiment, one, a plurality, and/or each, of the at least one inductor structure 960 may be electrically isolated from each of the redistribution wiring interconnects 924 and semiconductor dies to be subsequently attached to the interposer 900. The spiral-like configuration of each inductor structure 960 may include a single spiral, a plurality of spirals in a parallel connection, and/or a plurality of spirals in a series connection. FIGS. 3F-3H illustrate configurations in which an inductor structure 960 has a closed-loop configuration. FIG. 3F illustrates a configuration in which an inductor structure 960 includes a single spiral. FIG. 3G illustrates a configuration in which an inductor structure 960 includes two spiral segments that are connected in a parallel connection. FIG. 3H illustrates a configuration in which an inductor structure 960 includes two spiral segments that may be connected in a series connection. In this embodiment, a first inductor structure 960 and a second inductor structure 960 may overlie, or underlie, each other, may be electrically isolated from each other, and may have an areal overlap in the plan view.

Figure 4A:
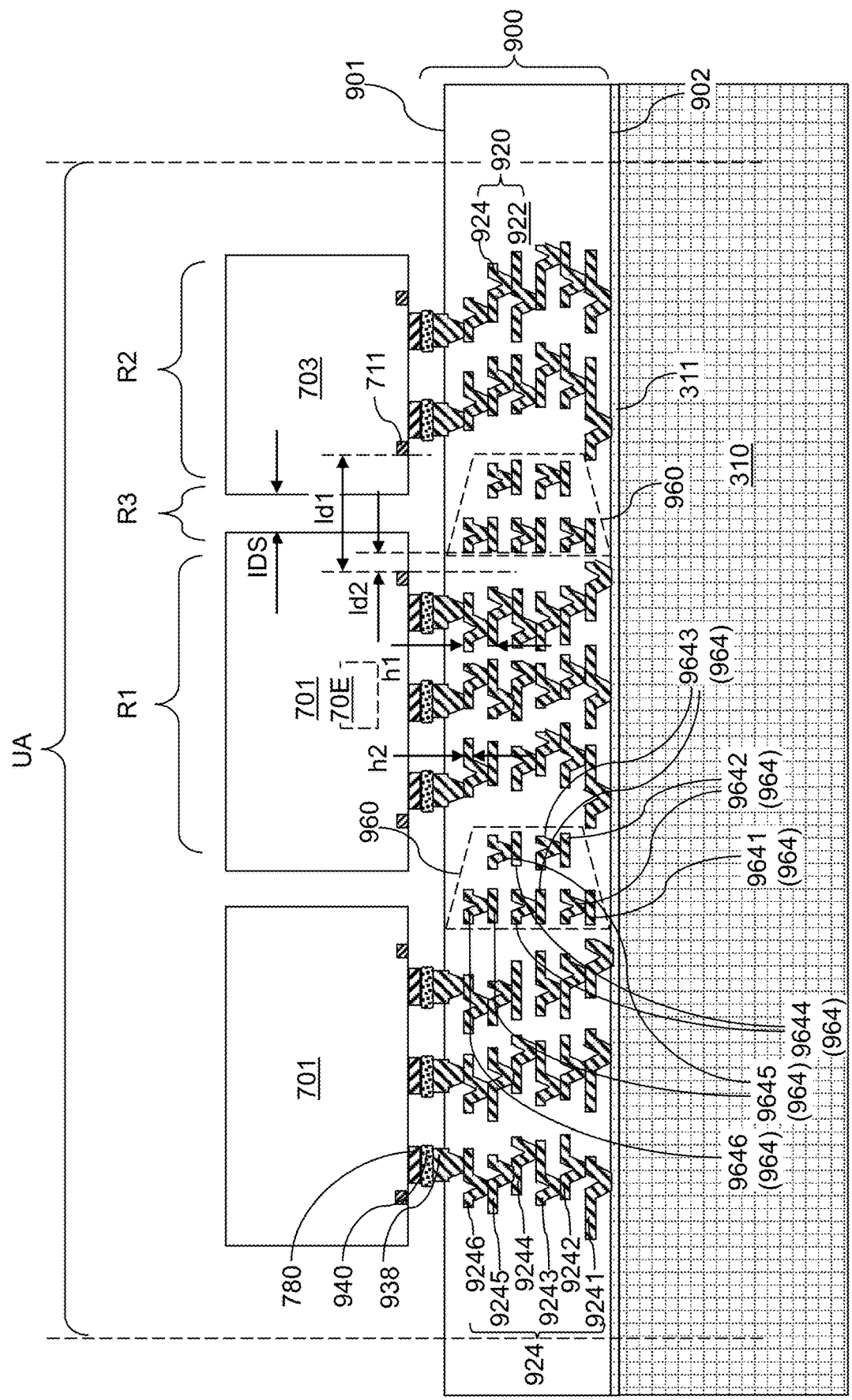
FIG. 4A is a vertical cross-sectional view of the structure after attaching semiconductor dies using first solder material portions according to an embodiment of the present disclosure.
Figure 4B:
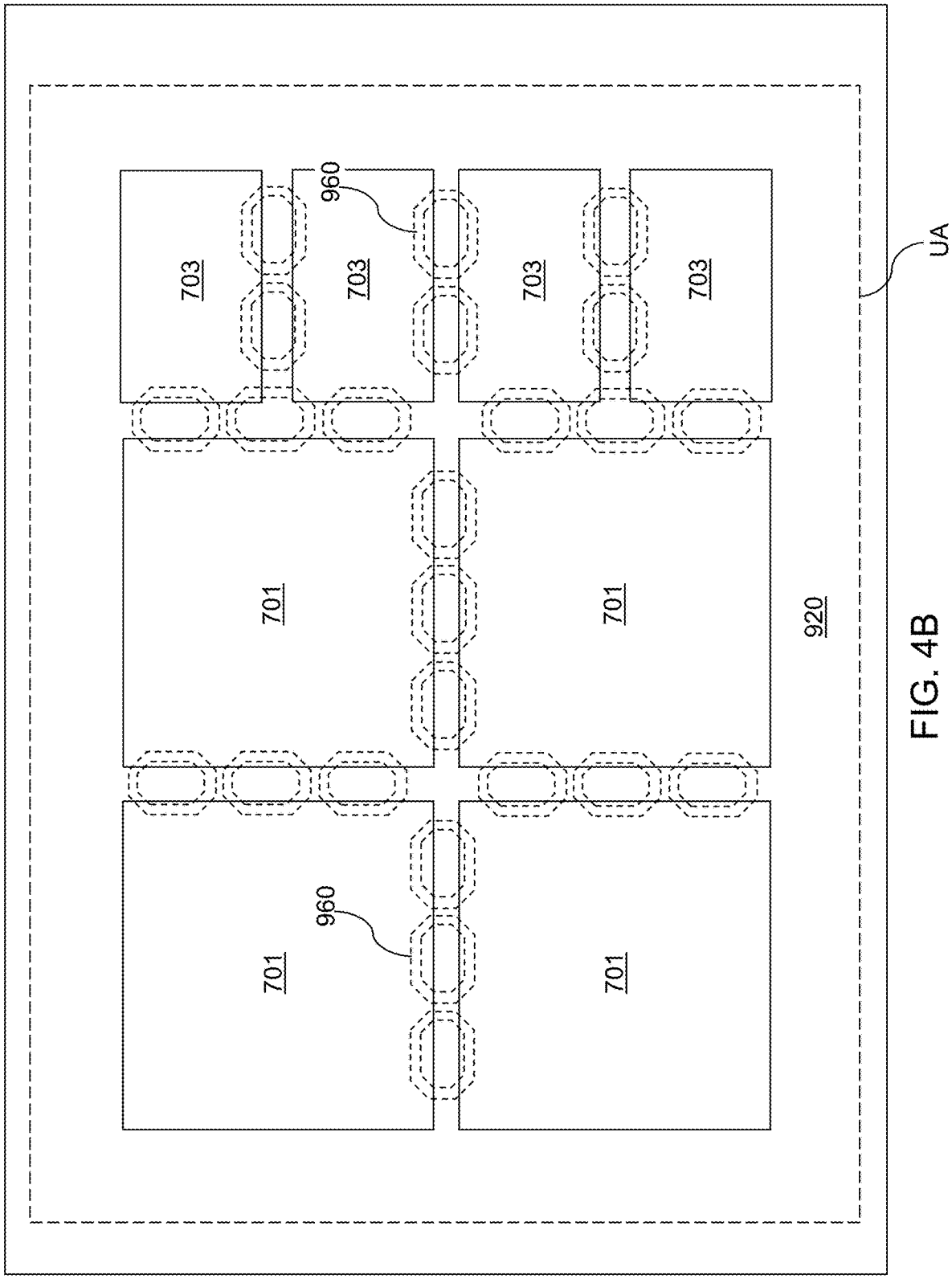
FIG. 4B is a top-down view of the structure of FIG. 4A.
Figure 4C:
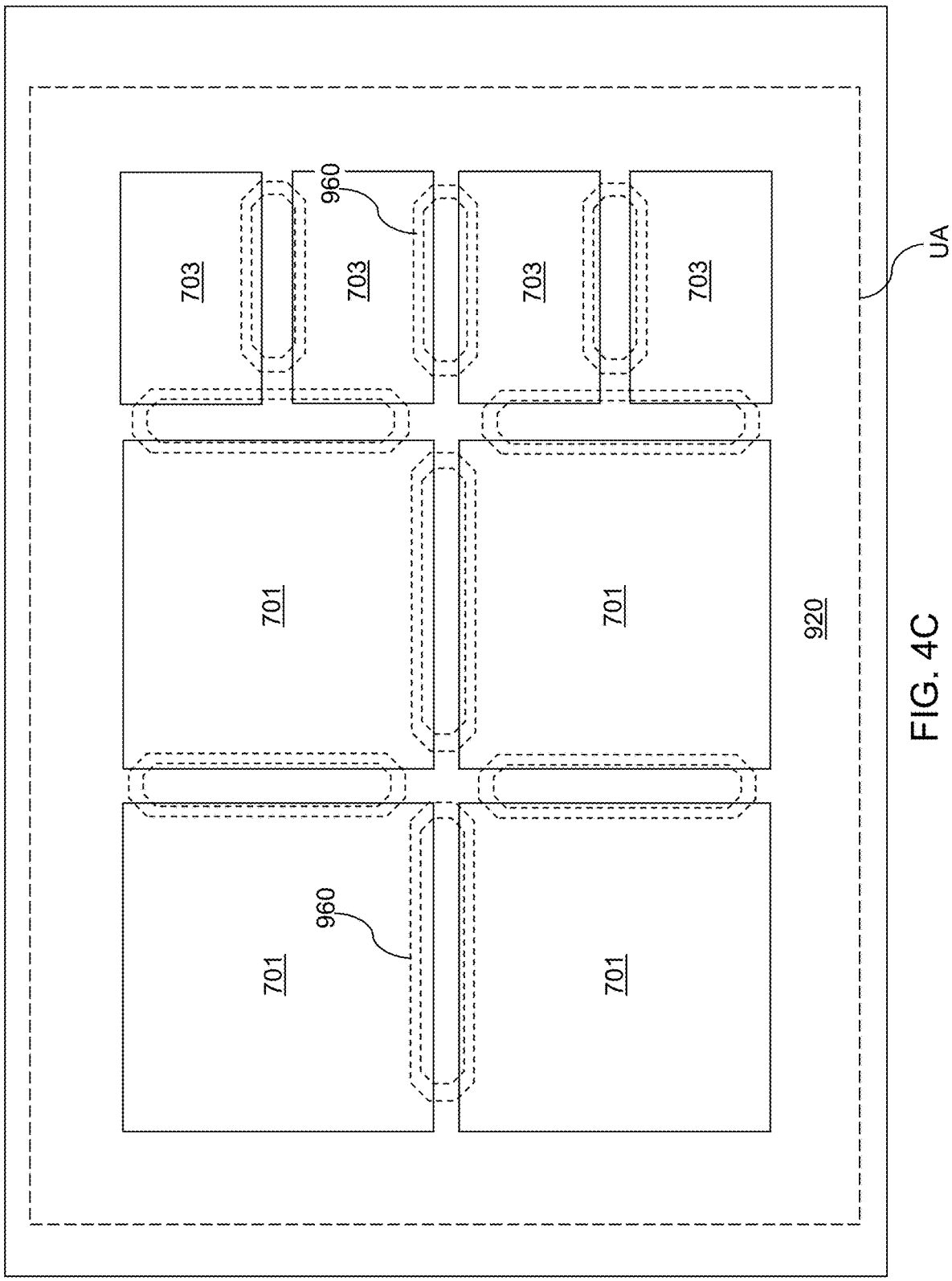
FIG. 4C is a top-down view of an alternative configuration of the structure of FIG. 4A.

FIG. 4A is a vertical cross-sectional view of the structure after attaching semiconductor dies (701, 703) to each interposer 900 using first solder material portions 940 according to an embodiment of the present disclosure. FIG. 4B is a top-down view of the exemplary structure of FIG. 4A. FIG. 4C is a top-down view of an alternative configuration of the exemplary structure of FIG. 4A.

Referring to FIGS. 4A-4C, a set of at least one semiconductor die (701, 703) may be bonded to each interposer 900. In one embodiment, the interposers 900 may be arranged as a two-dimensional periodic array, and multiple sets of at least one semiconductor die (701, 703) may be bonded to the interposer 900 as a two-dimensional periodic rectangular array of sets of the at least one semiconductor die (701, 703). Each set of at least one semiconductor die (701, 703) includes at least one semiconductor die. Each set of at least one semiconductor die (701, 703) may include any set of at least one semiconductor die known in the art. In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die 701 and a high bandwidth memory (HBM) die including a vertical stack of static random access memory (SRAM) dies that are interconnected to one another through microbumps and are laterally surrounded by an epoxy molding material enclosure frame.

Each semiconductor die (701, 703) may comprise a respective array of die-side bump structures 780. Each of the semiconductor dies (701, 703) may be positioned in a face-down position such that die-side bump structures 780 face the first solder material portions 940. Each set of at least one semiconductor die (701, 703) may be placed within a respective unit area UA. Placement of the semiconductor dies (701, 703) may be performed using a pick and place apparatus such that each of the die-side bump structures 780 may be placed on a top surface of a respective one of the first solder material portions 940.

Generally, an interposer 900 including interposer-side bump structures 938 thereupon may be provided, and at least one semiconductor die (701, 703) including a respective set of die-side bump structures 780 may be provided. The at least one semiconductor die (701, 703) may be bonded to the interposer 900 using first solder material portions 940, which are bonded to a respective interposer-side bump structure 938 and to a respective one of the die-side bump structures 780. Each set of at least one semiconductor die (701, 703) may be attached to a respective interposer 900 through a respective set of first solder material portions 940. Each of the at least one cushioning film within a unit area UA may be located outside an area including the at least one semiconductor die (701, 703) in the unit area UA in a plan view. The plan view is a view along a vertical direction, which is the direction that is perpendicular to the planar top surface of the redistribution structure layer.

In one embodiment, a set of at least two semiconductor dies (701, 703) may be attached to each interposer 900. The set of at least two semiconductor dies (701, 703) may comprise a first semiconductor die (which may be an SoC die 701 or a memory die 703) that is attached to the interposer 900 over the first region R1 of the organic interposer 900, and a second semiconductor die (which may be an SoC die 701 or a memory die 703) that is attached to the interposer 900 over the second region R2 of the organic interposer 900. One of the at least one inductor structure 960 comprises a portion located within an area of a gap between the first semiconductor die and the second semiconductor die in a plan view. This area of a gap between the first semiconductor die and the second semiconductor die in a plan view may also be referred to as region R3. In one embodiment, one of the at least one inductor structure 960 may have an areal overlap with a peripheral portion of the first semiconductor die (which may be an SoC die 701 or a memory die 703) and with a peripheral portion of the second semiconductor die (which may be an SoC die 701 or a memory die 703) in the plan view.

In some embodiments, one or more of the semiconductor dies (701, 703) may comprise an external circuit 70E that is configured to be connected to one or more of the at least one inductor structure 960. The external circuit 70E may be configured for energy storage, or may comprise a capacitor and/or a harmonic filtering circuit that may be configured to enhance general filtering characteristics and/or to tune for filtering of electromagnetic signals in a specific wavelength range.

In one embodiment, each of the semiconductor dies (701, 703) may have a respective edge seal metallic structure 711, which may be an outermost metallic structure that provides a continuous set of metallic sealing surfaces around a respective semiconductor die (701, 703). In one embodiment, an edge seal metallic structure 711 of the first semiconductor die (which may be an SoC die 701 or a memory die 703) and an edge seal metallic structure 711 of the second semiconductor die (which may be an SoC die 701 or a memory die 703) are laterally spaced from each other by a first lateral distance ld1 upon attaching the first semiconductor die and the second semiconductor die to the interposer 900. At least one inductor structure 960 may be located in a region R3 between the areas of the first semiconductor die (i.e., region R1) and the second semiconductor die (i.e., region R2), and may be laterally spaced from the edge seal metallic structure 711 of the first semiconductor die and from the edge seal metallic structure 711 of the second semiconductor die at least by a second lateral distance ld2 that is less than the first lateral distance ld1. The first lateral distance ld1 may be in a range from 10 microns to 1 mm, such as from 50 microns to 300 microns, although lesser and greater lateral distances may also be used. The second lateral distance ld2 may be in a range from 0 nm to 200 microns, such as from 10 microns to 100 microns, although lesser distances may also be used. The ratio of the second lateral distance ld2 to the first lateral distance ld1 may be in a range from 0 to 0.5.

In one embodiment, the second semiconductor die (which may be an SoC die 701 or a memory die 703) is laterally spaced from the first semiconductor die (which may be an SoC die 701 or a memory die 703) by an inter-die spacing IDS along a horizontal direction upon attaching the first semiconductor die and the second semiconductor die to the interposer 900. In one embodiment, the at least one inductor structure 960 has a width along the horizontal direction that is greater than the inter-die spacing IDS, and may have an areal overlap with a peripheral portion of the first semiconductor die that is located outside the edge seal metallic structure 711 of the first semiconductor die, and may have an areal overlap with a peripheral portion of the second semiconductor die that is located outside the edge seal metallic structure 711 of the second semiconductor die.

In one embodiment, an interposer 900 includes redistribution wiring interconnects 924 and redistribution insulating layers 922. A first semiconductor die (which may be an SoC die 701 or a memory die 703) may be attached to the interposer 900 through a first array of solder material portions 940, and a second semiconductor die (which may be an SoC die 701 or a memory die 703) may be attached to the interposer 900 through a second array of solder material portions 940. In one embodiment, the interposer 900 comprises at least one inductor structure 960 located between an area of the first array of solder material portions 940 and an area of the second array of solder material portions 940 in a plan view and laterally encloses a respective area in the plan view.

Figure 5:
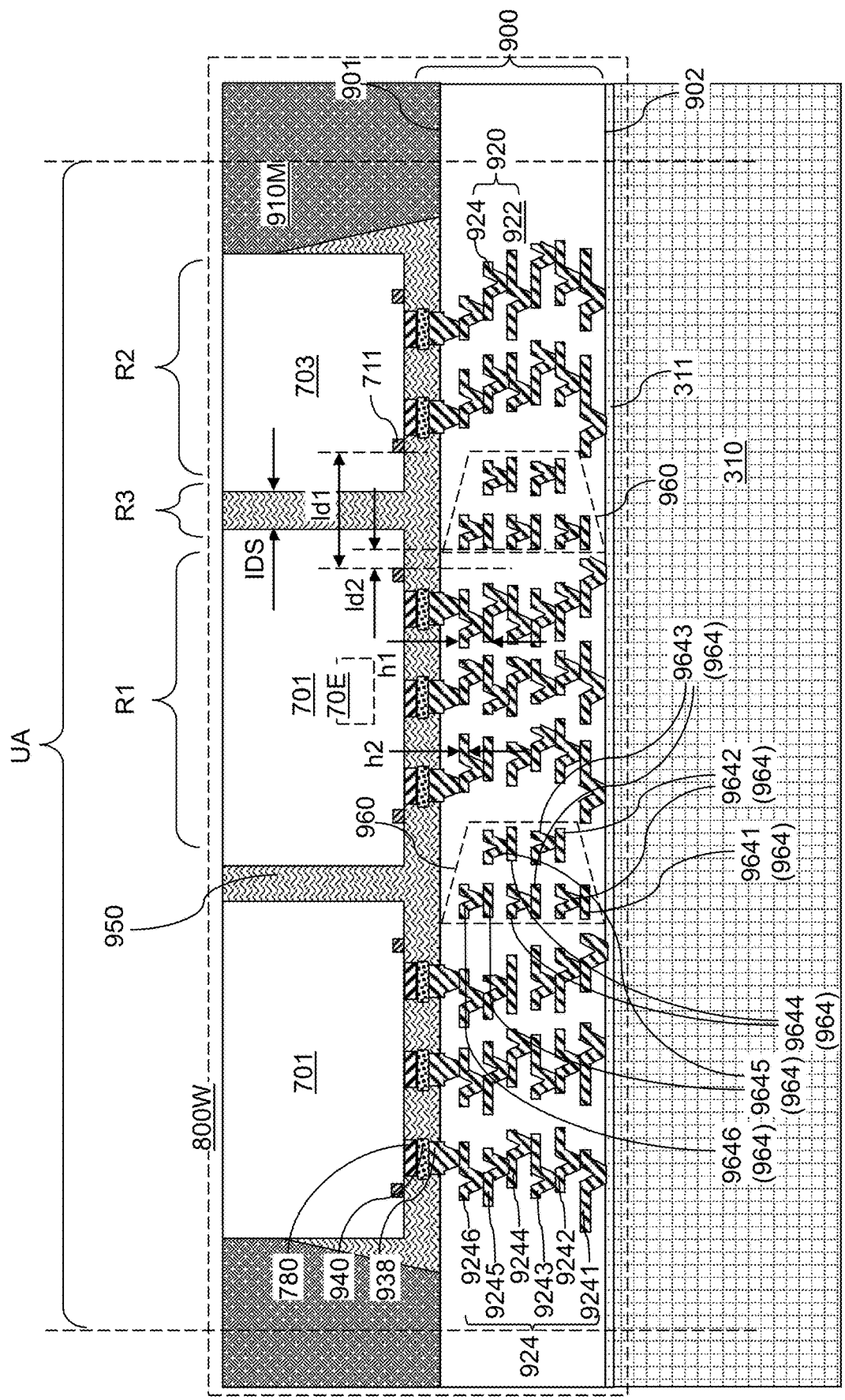
FIG. 5 is a vertical cross-sectional view of the structure after formation of first underfill material portions and an epoxy molding compound (EMC) matrix according to an embodiment of the present disclosure.

Referring to FIG. 5, a first underfill material may be applied into each gap between the interposers 900 and sets of at least one semiconductor die (701, 703) that are bonded to the interposers 900. The first underfill material may comprise any underfill material known in the art. A first underfill material portion 950 may be formed within each unit area UA between a interposer 900 and an overlying set of at least one semiconductor die (701, 703). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the interposer-side bump structures 938, and the die-side bump structures 780 in the unit area UA. Each interposer 900 in a unit area UA comprises interposer-side bump structures 938. At least one semiconductor die (701, 703) comprising a respective set of die-side bump structures 780 is attached to the interposer-side bump structures 938 through a respective set of first solder material portions 940 within each unit area UA. Within each unit area UA, a first underfill material portion 950 laterally surrounds the interposer-side bump structures 938 and the die-side bump structures 780 of the at least one semiconductor die (701, 703). Within each unit area UA, an underfill material portion 950 may be formed between the interposer 900 and each of the first semiconductor die (which may be an SoC die 701 or a memory die 703) and the second semiconductor die (which may be an SoC die 701 or a memory die 703), and may have an areal overlap with the at least one inductor structure 960 in the plan view.

An epoxy molding compound (EMC) may be applied to the gaps between contiguous assemblies of a respective set of semiconductor dies (701, 703) and a first underfill material portion 950. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flow ability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 311 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (701, 703) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (701, 703) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (701, 703) may be removed by a planarization process. For example, the portions of the EMC matrix 910M that overlies the horizontal plane may be removed using a chemical mechanical planarization (CMP). The combination of the remaining portion of the EMC matrix 910M, the semiconductor dies (701, 703), the first underfill material portions 950, and the two-dimensional array of interposers 900 comprises a reconstituted wafer 800W. Each portion of the EMC matrix 910M located within a unit area UA constitutes an EMC die frame.

Figure 6:
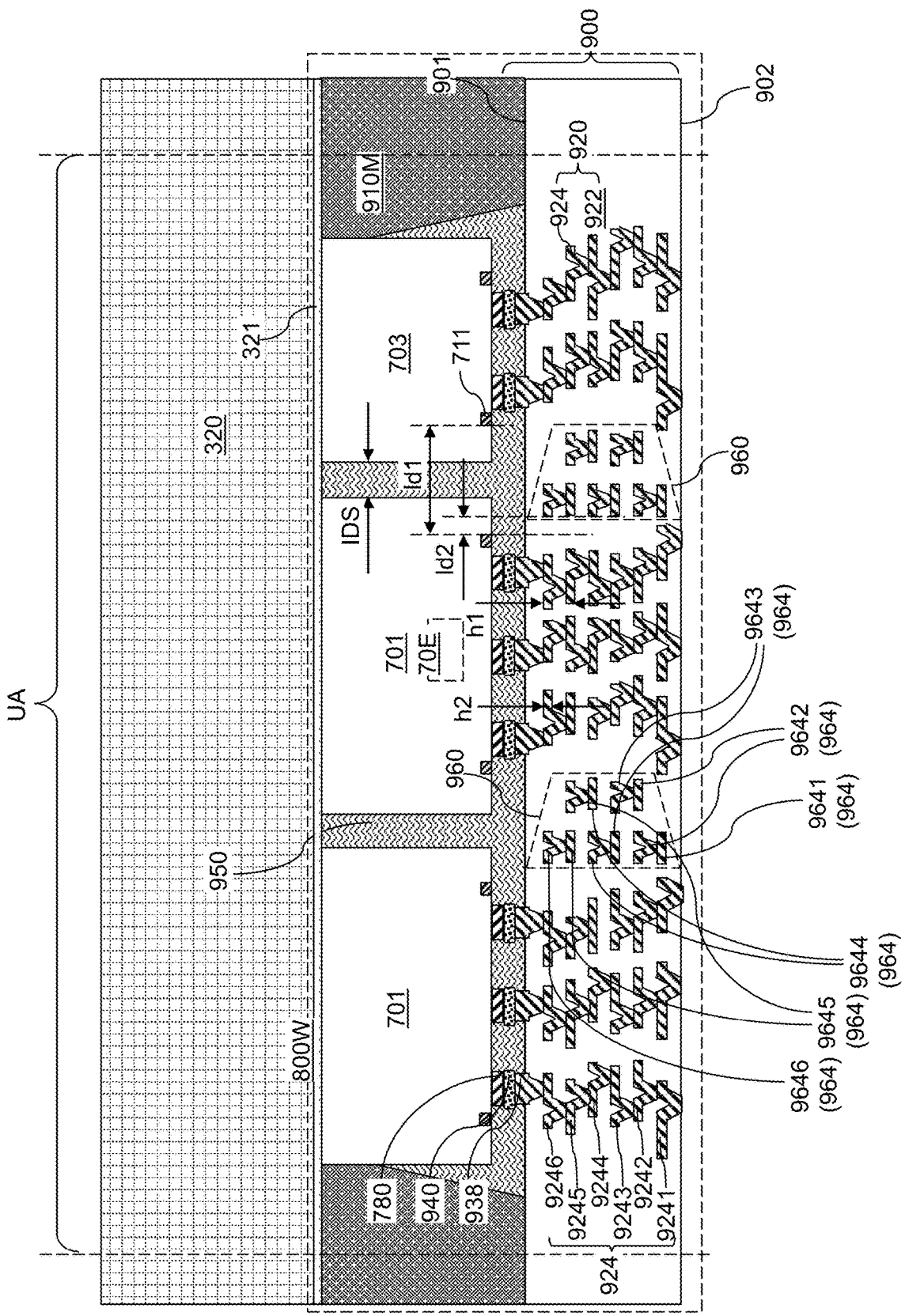
FIG. 6 is a vertical cross-sectional view of the structure after attaching a second carrier wafer and detaching a second carrier wafer according to an embodiment of the present disclosure.

Referring to FIG. 6, a second adhesive layer 321 may be applied to the physically exposed planar surface of the reconstituted wafer 800W, i.e., the physically exposed surfaces of the EMC matrix 910M, the semiconductor dies (701, 703), and the first underfill material portions 950. In one embodiment, the second adhesive layer 321 may comprise a same material as, or may comprise a different material from, the material of the first adhesive layer 311. In embodiments in which the first adhesive layer 311 comprises a thermally decomposing adhesive material, the second adhesive layer 321 may comprise another thermally decomposing adhesive material that decomposes at a higher temperature, or may comprise a light-to-heat conversion material.

A second carrier substrate 320 may be attached to the second adhesive layer 321. The second carrier substrate 320 may be attached to the opposite side of the reconstituted wafer 800W relative to the first carrier substrate 310. Generally, the second carrier substrate 320 may comprise any material that may be used for the first carrier substrate 310. The thickness of the second carrier substrate 320 may be in a range from 500 microns to 2,000 microns, although lesser and greater thicknesses may also be used.

The first adhesive layer 311 may be decomposed by ultraviolet radiation or by a thermal anneal at a debonding temperature. In embodiments in which the first carrier substrate 310 includes an optically transparent material and the first adhesive layer 311 includes an LTHC layer, the first adhesive layer 311 may be decomposed by irradiating ultraviolet light through the transparent carrier substrate. The LTHC layer may be absorb the ultraviolet radiation and generate heat, which decomposes the material of the LTHC layer and cause the transparent first carrier substrate 310 to be detached from the reconstituted wafer 800W. In embodiments in which the first adhesive layer 311 includes a thermally decomposing adhesive material, a thermal anneal process at a debonding temperature may be performed to detach the first carrier substrate 310 from the reconstituted wafer 800W.

Figure 7:
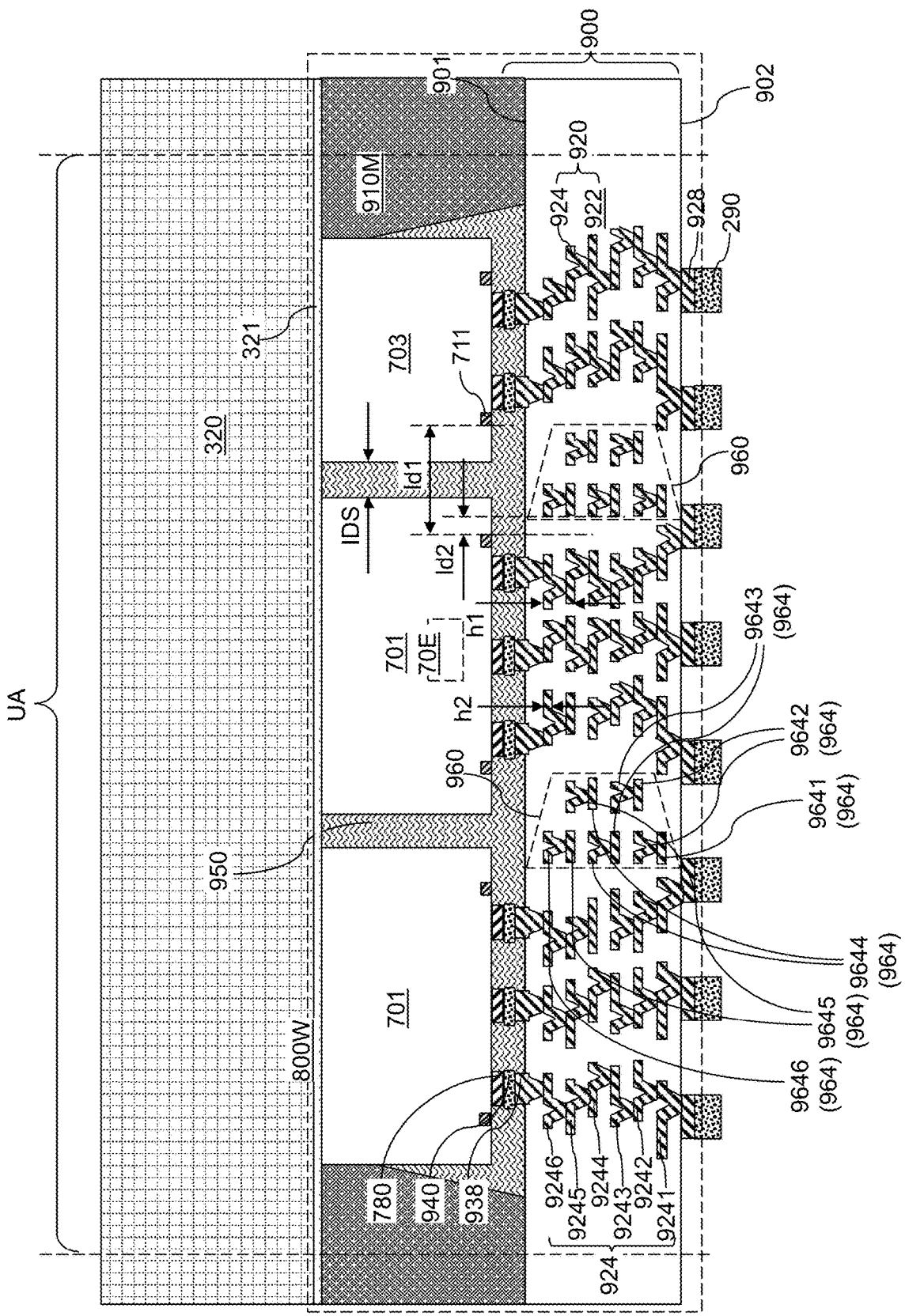
FIG. 7 is a vertical cross-sectional view of the structure after formation of fan-out bonding pads and second solder material portions according to an embodiment of the present disclosure.

Referring to FIG. 7, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable metallic fill materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable horizontal cross-sectional shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns.

The fan-out bonding pads 928 and the second solder material portions 290 may be formed on the opposite side of the interposer 900 from the EMC matrix 910M and the two-dimensional array of sets of semiconductor dies (701, 703) relative to the redistribution structure layer. The redistribution structure layer includes a three-dimensional array of redistribution structures 920. Each interposer 900 may be located within a respective unit area UA. Each interposer 900 may include redistribution dielectric layers 922, redistribution wiring interconnects 924 embedded in the redistribution dielectric layers 922, and fan-out bonding pads 928. The fan-out bonding pads 928 may be located on an opposite side of the interposer 900 from the interposer-side bump structures 938 relative to the redistribution dielectric layers 922, and may be electrically connected to a respective one of the interposer-side bump structures 938. Each interposer 900 may also include the at least one inductor structure 960 formed within the redistribution dielectric layers 922.

Figure 8:
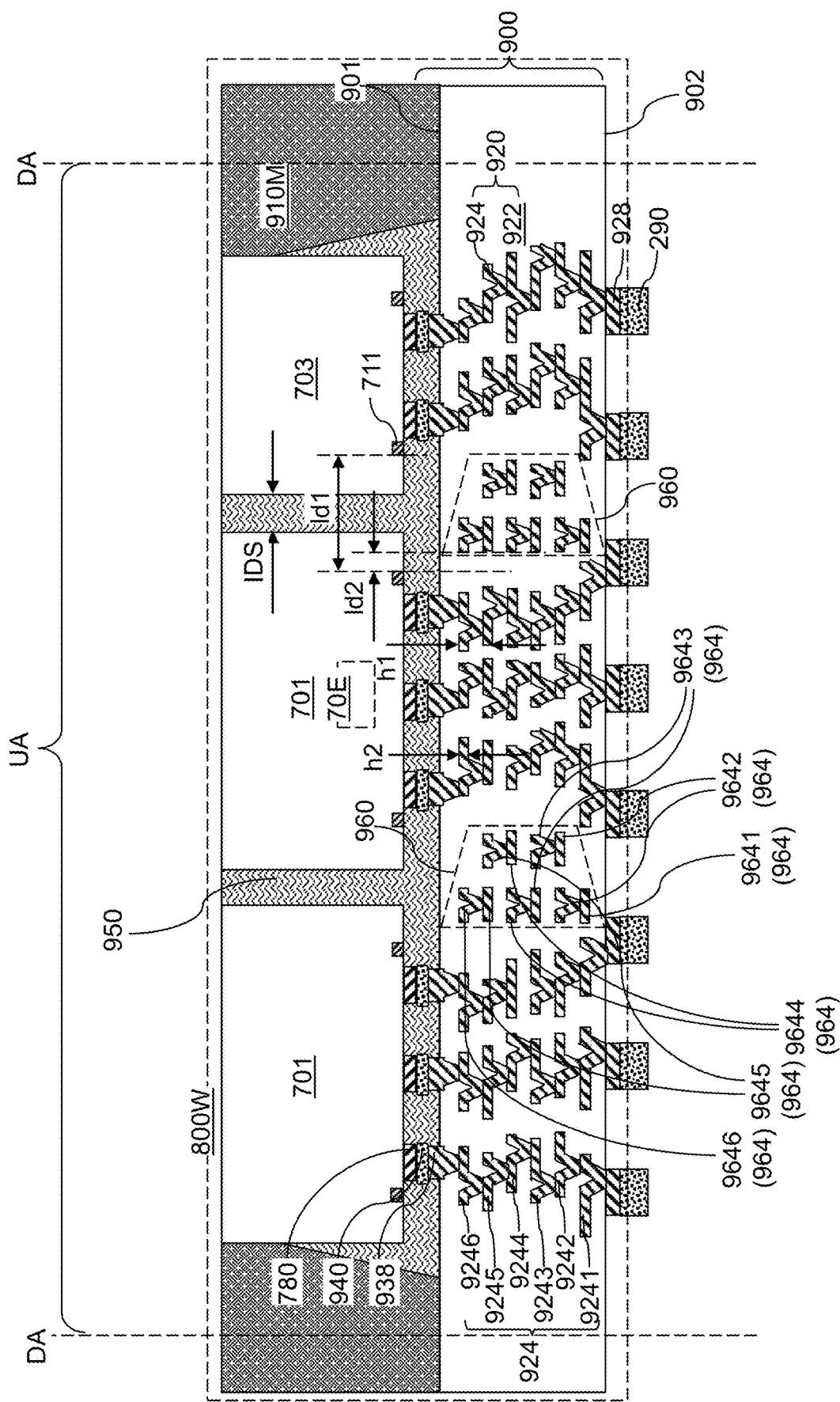
FIG. 8 is a vertical cross-sectional view of the structure after detaching the second carrier wafer according to an embodiment of the present disclosure.

Referring to FIG. 8, the second adhesive layer 321 may be decomposed by ultraviolet radiation or by a thermal anneal at a debonding temperature. In embodiments in which the second carrier substrate 320 includes an optically transparent material and the second adhesive layer 321 includes an LTHC layer, the second adhesive layer 321 may be decomposed by irradiating ultraviolet light through the transparent carrier substrate. In embodiments in which the second adhesive layer 321 includes a thermally decomposing adhesive material, a thermal anneal process at a debonding temperature may be performed to detach the second carrier substrate 320 from the reconstituted wafer 800W.

The reconstituted wafer 800W including the fan-out bonding pads 928 may be subsequently diced along dicing channels by performing a dicing process. The dicing channels correspond to the boundaries between neighboring pairs of die areas DA. Each diced unit from the reconstituted wafer 800W may include a fan-out package 800. In other words, each diced portion of the assembly of the two-dimensional array of sets of semiconductor dies (701, 703), the two-dimensional array of first underfill material portions 950, the EMC matrix 910M, and the two-dimensional array of interposers 900 constitutes a fan-out package 800. Each diced portion of the EMC matrix 910M constitutes a molding compound die frame 910. Each diced portion of the redistribution structure layer (which includes the two-dimensional array of redistribution structures 920) constitutes a interposer 900.

Figure 9:
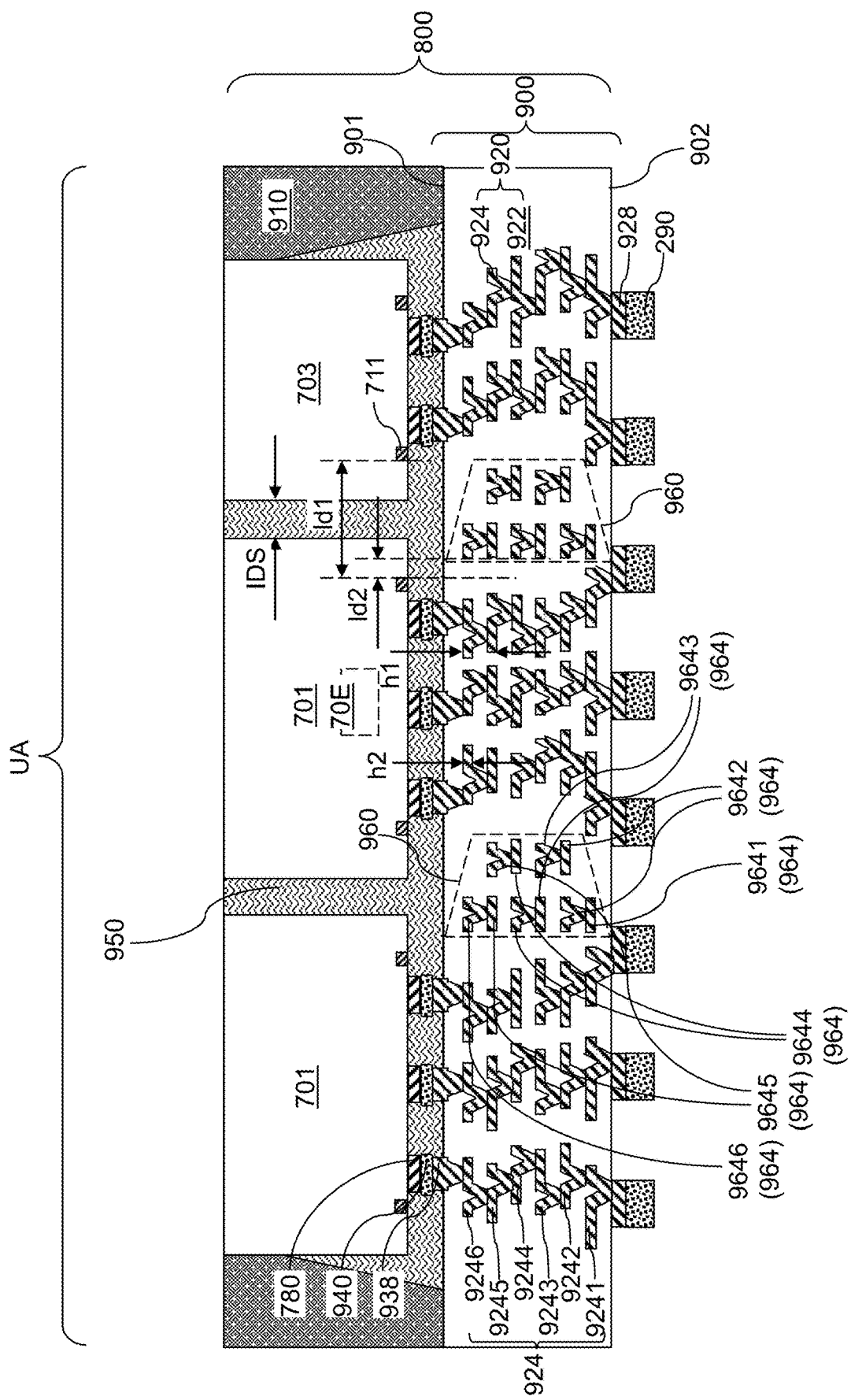
FIG. 9 is a vertical cross-sectional view of a fan-out package formed by dicing a reconstituted wafer in the structure of FIG. 8 according to an embodiment of the present disclosure.

Referring to FIG. 9, a fan-out package 800 obtained by dicing the structure is illustrated. The fan-out package 800 comprises a interposer 900 including interposer-side bump structures 938, at least one semiconductor die (701, 703) comprising a respective set of die-side bump structures 780 that is attached to the interposer-side bump structures 938 through a respective set of first solder material portions 940, a first underfill material portion 950 laterally surrounding the interposer-side bump structures 938 and the die-side bump structures 780 of the at least one semiconductor die (701, 703).

The fan-out package 800 may comprise a molding compound die frame 910 laterally surrounding the at least one semiconductor die (701, 703) and comprising a molding compound material. In one embodiment, the molding compound die frame 910 may include sidewalls that are vertically coincident with sidewalls of the interposer 900, i.e., located within same vertical planes as the sidewalls of the interposer 900. Generally, the molding compound die frame 910 may be formed around the at least one semiconductor die (701, 703) after formation of the first underfill material portion 950 within each fan-out package 800. The molding compound material contacts a peripheral portion of a planar surface of the interposer 900.

Figure 10:
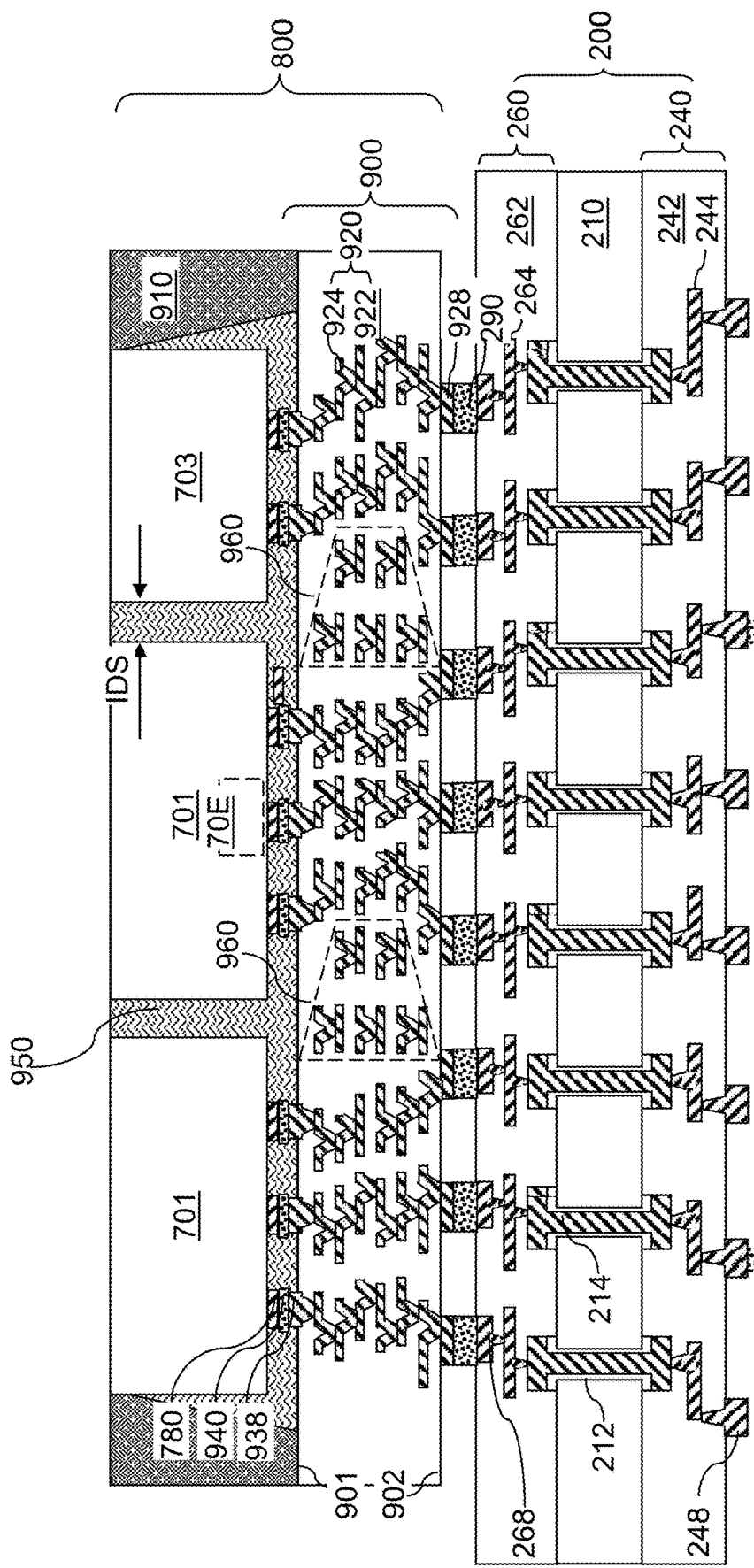
FIG. 10 is a vertical cross-sectional view of a structure after attaching the fan-out package to the packaging substrate according to an embodiment of the present disclosure.

Referring to FIG. 10, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The fan-out package 800 may be disposed over the packaging substrate 200 with an array of the second solder material portions 290 therebetween. In embodiments in which the second solder material portions 290 are formed on the fan-out bonding pads 928 of the fan-out package 800, the second solder material portions 290 may be disposed on the chip-side bonding pads 268 of the packaging substrate 200. A reflow process may be performed to reflow the second solder material portions 290, thereby inducing bonding between the fan-out package 800 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 900 is bonded to the packaging substrate 200 by an array of solder material portions (such as the second solder material portions 290).

Figure 11:
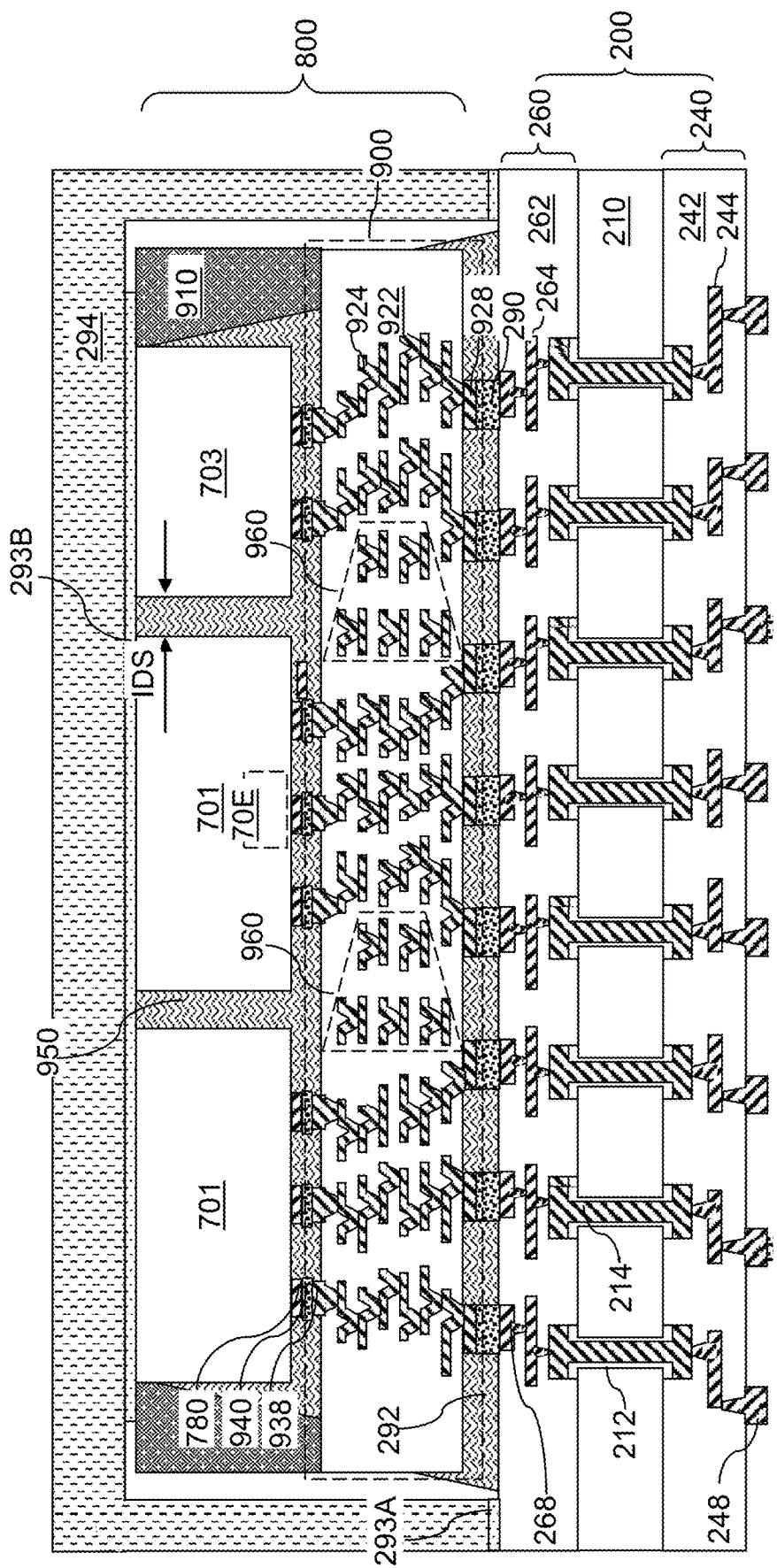
FIG. 11 is a vertical cross-sectional view of the structure after formation of a second underfill material portion and attachment of a stiffener structure according to an embodiment of the present disclosure.

Referring to FIG. 11, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method. The second underfill material portion 292 may be formed between the interposer 900 and the packaging substrate 200. The second underfill material portion 292 may contact each of the second solder material portions 290 (which may be C4 solder balls or C2 solder caps), and may contact vertical sidewalls of the fan-out package 800. The second underfill material portion laterally surrounds, and contacts, the array of second solder material portions 290 and the fan-out package 800.

Optionally, a stabilization structure 294, such as a cap structure or a ring structure, may be attached to the assembly of the fan-out package 800 and the packaging substrate 200 to reduce deformation of the assembly during subsequent processing steps and/or during usage of the assembly. The stabilization structure 294 may comprise a stiffener structure, and may be attached to the packaging substrate 200 using a first adhesive layer 293A and to the at least one semiconductor die (701, 703) using a second adhesive layer 293B.

In one embodiment, the fan-out package 800 comprises a molding compound die frame 910 that laterally surrounds the at least one semiconductor die (701, 703) and contacting a peripheral portion of a top surface of the interposer 900. The second underfill material portion 292 may be formed directly on sidewalls of the molding compound die frame 910.

Figure 12:
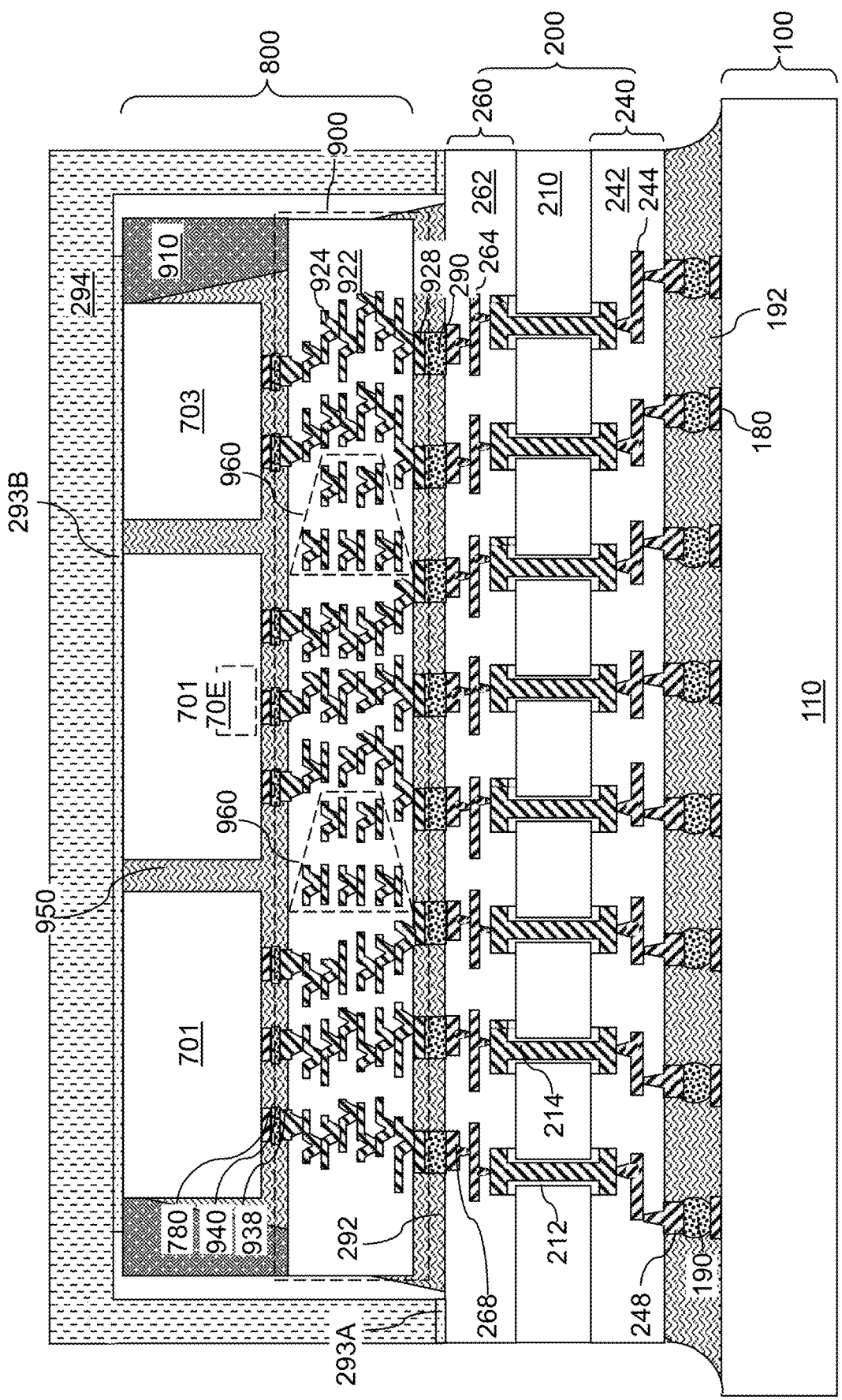
FIG. 12 is a vertical cross-sectional view of the structure after the packaging substrate is attached to a printed circuit board (PCB) according to an embodiment of the present disclosure.

Referring to FIG. 12, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 13:
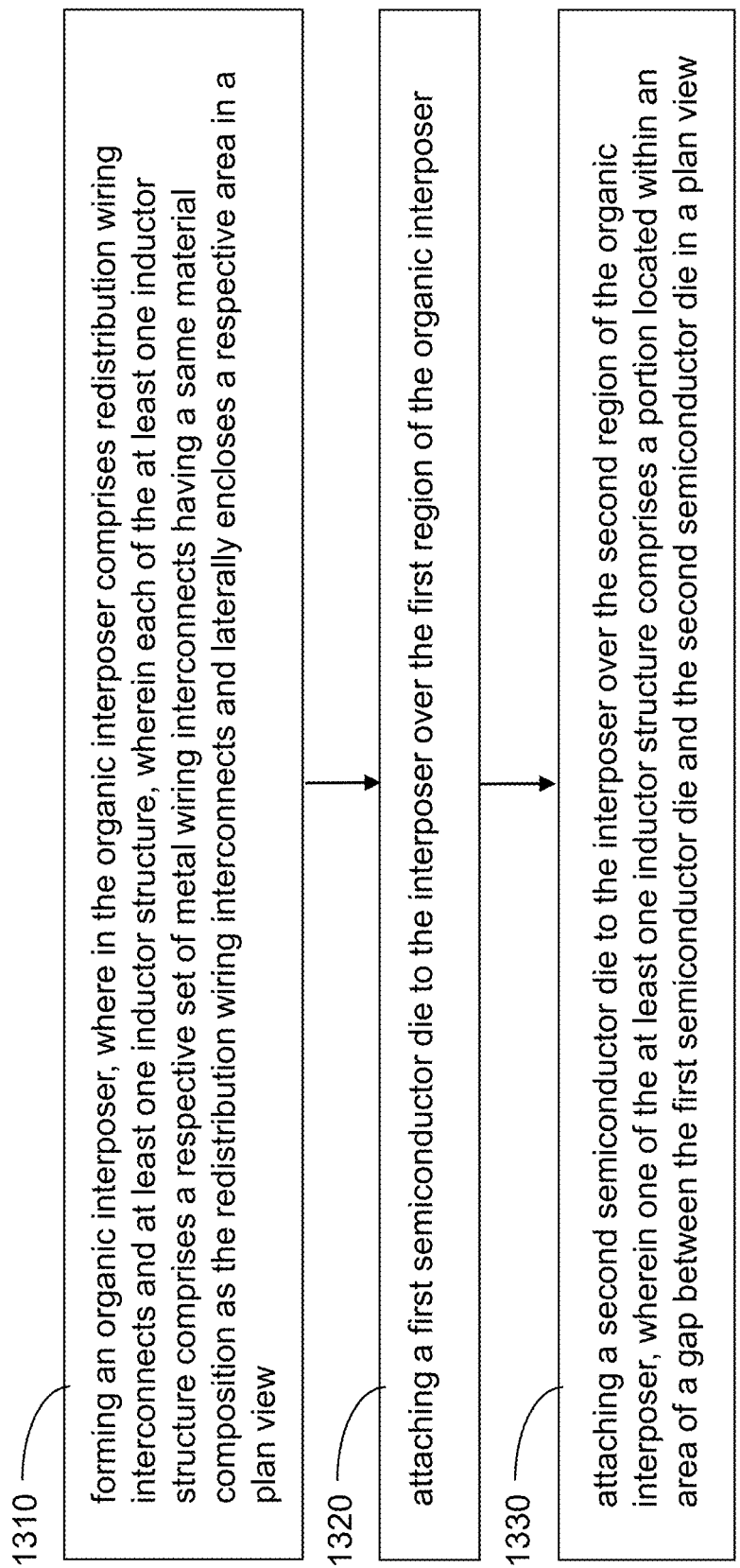
FIG. 13 is a flowchart illustrating steps for forming a structure according to an embodiment of the present disclosure.

FIG. 13 is a flowchart illustrating steps for forming an exemplary structure according to an embodiment of the present disclosure.

Referring to step 1310 and FIGS. 1-3F, an organic interposer 900 is formed. The organic interposer 900 comprises redistribution wiring interconnects 924 and at least one inductor structure 960. Each of the at least one inductor structure 960 comprises a respective set of metal wiring interconnects 964 having a same material composition as the redistribution wiring interconnects 924 and laterally encloses a respective area in a plan view.

Referring to step 1320 and FIGS. 4A-12, a first semiconductor die (which may be an SoC die 701 or a memory die 703) may be attached to the interposer 900 over the first region R1 of the organic interposer 900.

Referring to step 1330 and FIGS. 4A-12, a second semiconductor die (which may be an SoC die 701 or a memory die 703) may be attached to the interposer 900 over the second region R2 of the organic interposer 900. One of the at least one inductor structure 960 comprises a portion located within an area of a gap between the first semiconductor die (which may be an SoC die 701 or a memory die 703) and the second semiconductor die (which may be an SoC die 701 or a memory die 703) in a plan view.

Referring to all drawings and according to various embodiments of the present disclosure, a semiconductor structure is provided, which comprises: an interposer 900 including redistribution wiring interconnects 924 and redistribution insulating layers 922; a first semiconductor die (which may be an SoC die 701 or a memory die 703) attached to the interposer 900 through a first array of solder material portions 940; and a second semiconductor die (which may be an SoC die 701 or a memory die 703) attached to the interposer 900 through a second array of solder material portions 940, wherein the interposer 900 comprises at least one inductor structure 960 located between an area of the first array of solder material portions 940 and an area of the second array of solder material portions 940 in a plan view and laterally encloses a respective area in the plan view.

In one embodiment, one of the at least one inductor structure 960 has an areal overlap with a peripheral portion of the first semiconductor die (which may be an SoC die 701 or a memory die 703) and with a peripheral portion of the second semiconductor die (which may be an SoC die 701 or a memory die 703) in the plan view. In one embodiment, an edge seal metallic structure 711 of the first semiconductor die (which may be an SoC die 701 or a memory die 703) and an edge seal metallic structure 711 of the second semiconductor die (which may be an SoC die 701 or a memory die 703) are laterally spaced from each other by a first lateral distance ld1; and the at least one inductor structure 960 is laterally spaced from the edge seal metallic structure 711 of the first semiconductor die (which may be an SoC die 701 or a memory die 703) and from the edge seal metallic structure 711 of the second semiconductor die (which may be an SoC die 701 or a memory die 703) at least by a second lateral distance ld2 that is less than the first lateral distance ld1.

In one embodiment, the second semiconductor die (which may be an SoC die 701 or a memory die 703) is laterally spaced from the first semiconductor die (which may be an SoC die 701 or a memory die 703) by an inter-die spacing IDS along a horizontal direction; and the at least one inductor structure 960 has a width along the horizontal direction that is greater than the inter-die spacing IDS.

In one embodiment, the interposer 900 comprises a die-side horizontal surface 901 facing the first semiconductor die (which may be an SoC die 701 or a memory die 703) and the second semiconductor die (which may be an SoC die 701 or a memory die 703) and a substrate-side horizontal surface 902 located at an opposite side of the die-side horizontal surface 901; and the at least one inductor structure 960 comprises metal wiring interconnects 964 that are located at multiple levels having different vertical spacings from a horizontal plane including the substrate-side horizontal surface 902. In one embodiment, the redistribution wiring interconnects are located at multiple levels having different vertical spacings from the horizontal plane including the substrate-side horizontal surface 902; the metal wiring interconnects 964 comprise a same material as the redistribution wiring interconnects 924; and each of the metal wiring interconnects 964 is vertically spaced from the horizontal plane including the substrate-side horizontal surface 902 by a same vertical spacing as a respective one of the metal wiring interconnects 964. In one embodiment, one of the metal wiring interconnects 964 comprises a horizontally-extending line portion and at least one vertically-extending via portion that contacts a horizontally-extending line portion of another of the metal wiring interconnects 964.

In one embodiment, one of the at least one inductor structure 960 has a closed-loop configuration. In one embodiment, one of the at least one inductor structure 960 is electrically isolated from each of the redistribution wiring interconnects 924, the first semiconductor die (which may be an SoC die 701 or a memory die 703), and the second semiconductor die (which may be an SoC die 701 or a memory die 703). In one embodiment, the at least one inductor structure 960 comprises a first inductor structure 960 and a second inductor structure 960 that overlie, or underlie, each other, electrically isolated from each other, and having an areal overlap in the plan view.

In one embodiment, the semiconductor structure comprises: an underfill material portion 950 located between the interposer 900 and each of the first semiconductor die (which may be an SoC die 701 or a memory die 703) and the second semiconductor die (which may be an SoC die 701 or a memory die 703) and having an areal overlap with the at least one inductor structure 960 in the plan view; and a die frame 910 attached to the interposer 900 and laterally surrounding each of the first semiconductor die (which may be an SoC die 701 or a memory die 703) and the second semiconductor die (which may be an SoC die 701 or a memory die 703) and laterally surrounding the underfill material portion 950.

According to another aspect of the present disclosure, a semiconductor structure comprising an organic interposer 900 is provided. The organic interposer 900 comprises: a stack of redistribution insulating layers 922; a first set of redistribution wiring interconnects 924 laterally surrounded by the stack of redistribution insulating layers 922 and located in a first region R1; a second set of redistribution wiring interconnects 924 laterally surrounded by the stack of redistribution insulating layers 922 and located in a second region R2; and at least one inductor structure 960 laterally surrounded by the stack of redistribution insulating layers 922 and located in a third region R3 between the first region R1 and the second region R2, wherein each of the at least one inductor structure 960 comprises a respective set of metal wiring interconnects 964 having a same material composition as the first set of redistribution wiring interconnects 924 and the second set of redistribution wiring interconnects 924, and laterally encloses a respective area in a plan view.

In one embodiment, one of the at least one inductor structure 960 is in a closed-loop configuration, and is electrically isolated from any other conductive structure located within, or on, the organic interposer 900.

In one embodiment, the organic interposer 900 comprises a die-side horizontal surface 901 and a substrate-side horizontal surface 902 located at opposite sides; and the respective set of metal wiring interconnects 964 comprises a plurality of respective metal wiring interconnects 964 that are located at multiple levels having different vertical spacings from a horizontal plane including the substrate-side horizontal surface 902.

In one embodiment, each metal wiring interconnect among the plurality of respective metal wiring interconnects 964 is equidistant from the horizontal plane including the substrate-side horizontal surface 902 as a respective redistribution wiring interconnect among the first set of redistribution wiring interconnects 924, and as a respective redistribution wiring interconnect among the second set of redistribution wiring interconnects 924.

The various embodiments of the present disclosure provide an inductor structure 960 providing an inductive function at an inductance areal density at a die-to-die gap area within redistribution dielectric layers 922 in an organic interposer 900. The electrical performance, in terms of suppression of cross-channel electrical noise at high signal transmission frequencies, may be enhanced through use of the inductor structure 960. The inductor structure 960 may use a spiral-like metal line-via routing structure. The inductor structure 960 of the present disclosure provides inherent advantages in terms of flexibility in metal routing design to enhance signal integrity and power integrity. Manufacture of the inductor structure 960 of the present disclosure does not require any additional processing step, and radio-frequency cross-die electrical noise may be effectively suppressed by the inductor structure 960 of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an interposer including redistribution wiring interconnects and redistribution insulating layers;
a first semiconductor die attached to the interposer through a first array of solder material portions; and
a second semiconductor die attached to the interposer through a second array of solder material portions, wherein:
the interposer comprises at least one inductor structure located between an area of the first array of solder material portions and an area of the second array of solder material portions in a plan view and laterally encloses a respective area in the plan view;
the at least one inductor structure has a closed-loop configuration containing a spiral-like metal line-via routing structure that defines an enclosed area in the plan view and is electrically isolated from any other conductive structure located within, or on, the interposer;
the spiral-like metal line-via routing structure comprises at least two metal wiring interconnects that are vertically offset from each other or among one another; and
the spiral-like metal line-via routing structure comprises at least two closed-loop spiral segments that are vertically spaced apart and are attached to each other or among one another through at least two vias.

2. The semiconductor structure of claim 1, wherein one of the at least one inductor structure has an areal overlap with a peripheral portion of the first semiconductor die and with a peripheral portion of the second semiconductor die in the plan view.

3. The semiconductor structure of claim 1, wherein:
an edge seal metallic structure of the first semiconductor die and an edge seal metallic structure of the second semiconductor die are laterally spaced from each other by a first lateral distance; and
the at least one inductor structure is laterally spaced from the edge seal metallic structure of the first semiconductor die and from the edge seal metallic structure of the second semiconductor die at least by a second lateral distance that is less than the first lateral distance.

4. The semiconductor structure of claim 1, wherein:
the second semiconductor die is laterally spaced from the first semiconductor die by an inter-die spacing along a horizontal direction; and
the at least one inductor structure has a width along the horizontal direction that is greater than the inter-die spacing.

5. The semiconductor structure of claim 1, wherein:
the interposer comprises a die-side horizontal surface facing the first semiconductor die and the second semiconductor die and a substrate-side horizontal surface located at an opposite side of the die-side horizontal surface; and
the at least one inductor structure comprises metal wiring interconnects that are located at multiple levels having different vertical spacings from a horizontal plane including the substrate-side horizontal surface.

6. The semiconductor structure of claim 5, wherein:
the redistribution wiring interconnects are located at multiple levels having different vertical spacings from the horizontal plane including the substrate-side horizontal surface;
the metal wiring interconnects comprise a same material as the redistribution wiring interconnects; and
each of the metal wiring interconnects is vertically spaced from the horizontal plane including the substrate-side horizontal surface by a same vertical spacing as a respective one of the redistribution wiring interconnects.

7. The semiconductor structure of claim 5, wherein one of the metal wiring interconnects comprises a horizontally-extending line portion and at least one vertically-extending via portion that contacts a horizontally-extending line portion of another of the metal wiring interconnects.

8. The semiconductor structure of claim 1, wherein
the at least one inductor structure comprises a vertical stack of a plurality of inductor structures having an areal overlap among one another in a plan view.

9. The semiconductor structure of claim 1, wherein one of the at least one inductor structure is electrically isolated from each of the redistribution wiring interconnects, the first semiconductor die, and the second semiconductor die.

10. The semiconductor structure of claim 1, wherein the at least one inductor structure comprises a first inductor structure and a second inductor structure that overlie, or underlie, each other, electrically isolated from each other, and having an areal overlap in the plan view.

11. The semiconductor structure of claim 1, further comprising:
an underfill material portion located between the interposer and each of the first semiconductor die and the second semiconductor die and having an areal overlap with the at least one inductor structure in the plan view; and
a die frame attached to the interposer and laterally surrounding each of the first semiconductor die and the second semiconductor die and laterally surrounding the underfill material portion.

12. A semiconductor structure comprising an organic interposer, the organic interposer comprising:
a stack of redistribution insulating layers;

a first set of redistribution wiring interconnects laterally surrounded by the stack of redistribution insulating layers and located in a first region;

a second set of redistribution wiring interconnects laterally surrounded by the stack of redistribution insulating layers and located in a second region; and at least one inductor structure laterally surrounded by the stack of redistribution insulating layers and located in a third region between the first region and the second region, wherein:

each of the at least one inductor structure comprises a respective set of metal wiring interconnects having a same material composition as the first set of redistribution wiring interconnects and the second set of redistribution wiring interconnects, and laterally encloses a respective area in a plan view;

the at least one inductor structure has a closed-loop configuration containing a spiral-like metal line-via routing structure that defines an enclosed area in the plan view and is electrically isolated from any other conductive structure located within, or on, the interposer;

the spiral-like metal line-via routing structure comprises at least two metal wiring interconnects that are vertically offset from each other or among one another; and the spiral-like metal line-via routing structure comprises at least two closed-loop spiral segments that are vertically spaced apart and are attached to each other or among one another through at least two vias.

13. The semiconductor structure of claim 12, wherein:

the organic interposer comprises a die-side horizontal surface and a substrate-side horizontal surface located at opposite sides; and the respective set of metal wiring interconnects comprises a plurality of respective metal wiring interconnects that are located at multiple levels having different vertical spacings from a horizontal plane including the substrate-side horizontal surface.

14. The semiconductor structure of claim 13, wherein each metal wiring interconnect among the plurality of respective metal wiring interconnects is equidistant from the horizontal plane including the substrate-side horizontal surface as a respective redistribution wiring interconnect among the first set of redistribution wiring interconnects, and as a respective redistribution wiring interconnect among the second set of redistribution wiring interconnects.

15. A semiconductor structure comprising:

an interposer including redistribution wiring interconnects and redistribution insulating layers;

a first semiconductor die attached to the interposer through a first array of solder material portions; and a second semiconductor die attached to the interposer through a second array of solder material portions, wherein:

the interposer comprises at least one inductor structure located between an area of the first array of solder material portions and an area of the second array of solder material portions in a plan view, has a first partial areal overlap with a peripheral region of the first semiconductor die in the plan view, and has a second partial areal overlap with a peripheral region of the second semiconductor die in the plan view;

the at least one inductor structure has a closed-loop configuration containing a spiral-like metal line-via routing structure that defines an enclosed area in the plan view and is electrically isolated from any other conductive structure located within, or on, the interposer;

the spiral-like metal line-via routing structure comprises at least two metal wiring interconnects that are vertically offset from each other or among one another; and the spiral-like metal line-via routing structure comprises at least two closed-loop spiral segments that are vertically spaced apart and are attached to each other or among one another through at least two vias.

16. The semiconductor structure of claim 15, wherein:

an edge seal metallic structure of the first semiconductor die and an edge seal metallic structure of the second semiconductor die are laterally spaced from each other by a first lateral distance; and the at least one inductor structure is laterally spaced from the edge seal metallic structure of the first semiconductor die and from the edge seal metallic structure of the second semiconductor die at least by a second lateral distance that is less than the first lateral distance.

17. The semiconductor structure of claim 15, wherein:

the second semiconductor die is laterally spaced from the first semiconductor die by an inter-die spacing along a horizontal direction; and the at least one inductor structure has a width along the horizontal direction that is greater than the inter-die spacing.

18. The semiconductor structure of claim 15, wherein:

the interposer comprises a die-side horizontal surface facing the first semiconductor die and the second semiconductor die and a substrate-side horizontal surface located at an opposite side of the die-side horizontal surface; and the at least one inductor structure comprises metal wiring interconnects that are located at multiple levels having different vertical spacings from a horizontal plane including the substrate-side horizontal surface.

19. The semiconductor structure of claim 18, wherein:

the redistribution wiring interconnects are located at multiple levels having different vertical spacings from the horizontal plane including the substrate-side horizontal surface;

the metal wiring interconnects comprise a same material as the redistribution wiring interconnects; and each of the metal wiring interconnects is vertically spaced from the horizontal plane including the substrate-side horizontal surface by a same vertical spacing as a respective one of the redistribution wiring interconnects.

20. The semiconductor structure of claim 1, wherein:

the enclosed area of the at least one inductor structure is defined by inner sidewalls of the at least two closed-loop spiral segments in the plan view; and the enclosed area of the at least one inductor structure is free of any conductive material between a first horizontal plane including a topmost surface of the at least one inductor structure and a second horizontal plane including a bottommost surface of the at least one inductor structure.

* * * * *